(12) United States Patent
Lu et al.

(10) Patent No.: US 12,136,651 B2
(45) Date of Patent: Nov. 5, 2024

(54) SILICON-GERMANIUM FINS AND METHODS OF PROCESSING THE SAME IN FIELD-EFFECT TRANSISTORS

(71) Applicant: Taiwan Semiconductor Manufacturing Co., Ltd., Hsin-Chu (TW)

(72) Inventors: Yu-Shan Lu, Hsinchu County (TW); Hung-Ju Chou, Taipei (TW); Pei-Ling Gao, Hsinchu (TW); Chen-Hsuan Liao, Hsinchu (TW); Chih-Chung Chang, Nantou County (TW); Jiun-Ming Kuo, Taipei (TW); Che-Yuan Hsu, Hsinchu City (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 321 days.

(21) Appl. No.: 17/126,594

(22) Filed: Dec. 18, 2020

(65) Prior Publication Data

US 2021/0257462 A1    Aug. 19, 2021

Related U.S. Application Data

(60) Provisional application No. 62/978,508, filed on Feb. 19, 2020.

(51) Int. Cl.
*H01L 29/16* (2006.01)
*H01L 21/8238* (2006.01)
(Continued)

(52) U.S. Cl.
CPC ...... *H01L 29/16* (2013.01); *H01L 21/823821* (2013.01); *H01L 27/0924* (2013.01); *H01L 29/66795* (2013.01); *H01L 29/785* (2013.01)

(58) Field of Classification Search
CPC ..... H01L 21/823412; H01L 21/823418; H01L 21/823431; H01L 21/823437;
(Continued)

(56) References Cited

U.S. PATENT DOCUMENTS 8,796,666 B1    8/2014   Huang et al.
8,815,712 B2    8/2014   Wan et al.
(Continued)

FOREIGN PATENT DOCUMENTS

CN    104412389 A    3/2015
CN    106158958 A    11/2016
(Continued)

*Primary Examiner* — Mary A Wilczewski
(74) *Attorney, Agent, or Firm* — HAYNES AND BOONE, LLP

(57) ABSTRACT

A semiconductor structure includes a SiGe fin protruding from a substrate, where the SiGe fin includes a top portion having a first sidewall and a second sidewall and a bottom portion having a third sidewall and a fourth sidewall, and where a first transition region connecting the first sidewall to the third sidewall and a second transition region connecting the second sidewall to the fourth sidewall each have a tapered profile extending away from the first sidewall and the second sidewall, respectively, and a Si-containing layer disposed on the top portion of the SiGe fin, where a portion of the Si-containing layer on the first transition region extends away from the first sidewall by a first lateral distance and a portion of the Si-containing layer on the second transition region extends away from the second sidewall by a second lateral distance that is different from the first lateral distance.

20 Claims, 25 Drawing Sheets

(51) Int. Cl.
*H01L 27/092* (2006.01)
*H01L 29/66* (2006.01)
*H01L 29/78* (2006.01)

(58) Field of Classification Search
CPC ..... H01L 21/823462; H01L 21/823481; H01L 21/823807; H01L 21/823814; H01L 21/823821; H01L 21/823828; H01L 21/823857; H01L 21/823878; H01L 27/0886; H01L 27/0924; H01L 27/1211; H01L 29/0847; H01L 29/1033; H01L 29/16; H01L 29/401; H01L 29/41791; H01L 29/42356; H01L 29/66795; H01L 29/66818; H01L 29/785; H01L 29/7853

See application file for complete search history.

(56) References Cited

U.S. PATENT DOCUMENTS

| | | | |
|---|---|---|---|
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 9,680,022 B1 | 6/2017 | Chan | |
| 11,158,726 B2* | 10/2021 | Su | H01L 21/76224 |
| 11,302,535 B2* | 4/2022 | Tsai | H01L 29/517 |
| 11,581,425 B2* | 2/2023 | Yang | H01L 21/02337 |
| 2013/0221448 A1* | 8/2013 | Chang | H01L 29/66795 438/701 |
| 2013/0244392 A1* | 9/2013 | Oh | H01L 21/823821 438/299 |
| 2013/0256764 A1* | 10/2013 | Liaw | H01L 29/66795 257/E29.022 |
| 2014/0252413 A1 | 9/2014 | Utomo | |
| 2017/0005090 A1* | 1/2017 | Ando | H01L 29/0847 |
| 2017/0077095 A1* | 3/2017 | Lu | H01L 21/31111 |
| 2017/0133376 A1* | 5/2017 | Glass | H01L 29/785 |
| 2017/0133377 A1* | 5/2017 | Glass | H01L 21/3081 |
| 2017/0179291 A1* | 6/2017 | Lee | H01L 21/823412 |
| 2018/0247938 A1* | 8/2018 | Cheng | H01L 21/823821 |
| 2018/0315387 A1* | 11/2018 | Park | G09G 3/3674 |
| 2018/0315665 A1* | 11/2018 | Mosden | H01L 29/0673 |
| 2018/0366465 A1* | 12/2018 | Ching | H01L 29/161 |
| 2019/0164836 A1 | 5/2019 | Ghani et al. | |
| 2019/0165139 A1* | 5/2019 | Fan | H01L 29/0847 |
| 2020/0006084 A1* | 1/2020 | Tsai | H01L 29/66545 |
| 2020/0411513 A1* | 12/2020 | Jambunathan | H01L 27/0924 |
| 2021/0036130 A1* | 2/2021 | Su | H01L 21/823821 |
| 2021/0242332 A1* | 8/2021 | Ma | H01L 29/66795 |
| 2021/0257462 A1* | 8/2021 | Lu | H01L 21/823431 |
| 2021/0313428 A1* | 10/2021 | Li | H01L 21/823431 |
| 2022/0037487 A1* | 2/2022 | Liao | H01L 21/823462 |
| 2022/0059471 A1* | 2/2022 | Huang | H01L 29/0649 |
| 2022/0238350 A1* | 7/2022 | Tsai | H01L 29/785 |
| 2022/0293773 A1* | 9/2022 | Yang | H01L 21/30604 |
| 2022/0302299 A1* | 9/2022 | Lin | H01L 27/0924 |
| 2023/0011474 A1* | 1/2023 | Yu | H01L 29/66545 |
| 2023/0387213 A1* | 11/2023 | Lu | H01L 29/785 |

FOREIGN PATENT DOCUMENTS

| | | | | |
|---|---|---|---|---|
| CN | 106816414 | * | 6/2017 | ..... H01L 21/823807 |
| CN | 110556374 A | | 12/2019 | |
| CN | 113782441 | * | 12/2021 | ....... H01L 29/66795 |
| TW | 202004917 A | | 1/2020 | |

* cited by examiner

SILICON-GERMANIUM FINS AND METHODS OF PROCESSING THE SAME IN FIELD-EFFECT TRANSISTORS

CROSS-REFERENCE TO RELATED APPLICATIONS

This is a non-provisional application of and claims priority to U.S. Provisional Patent Application Ser. No. 62/978,508, filed on Feb. 19, 2020 the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. For example, at reduced length scales, challenges such as short-channel effects (SCEs) and tuning of threshold voltage ($V_t$) become more pronounced, thereby compromising performance of a device. While existing methods of addressing such challenges (e.g., introducing silicon germanium-based channels) have been generally adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
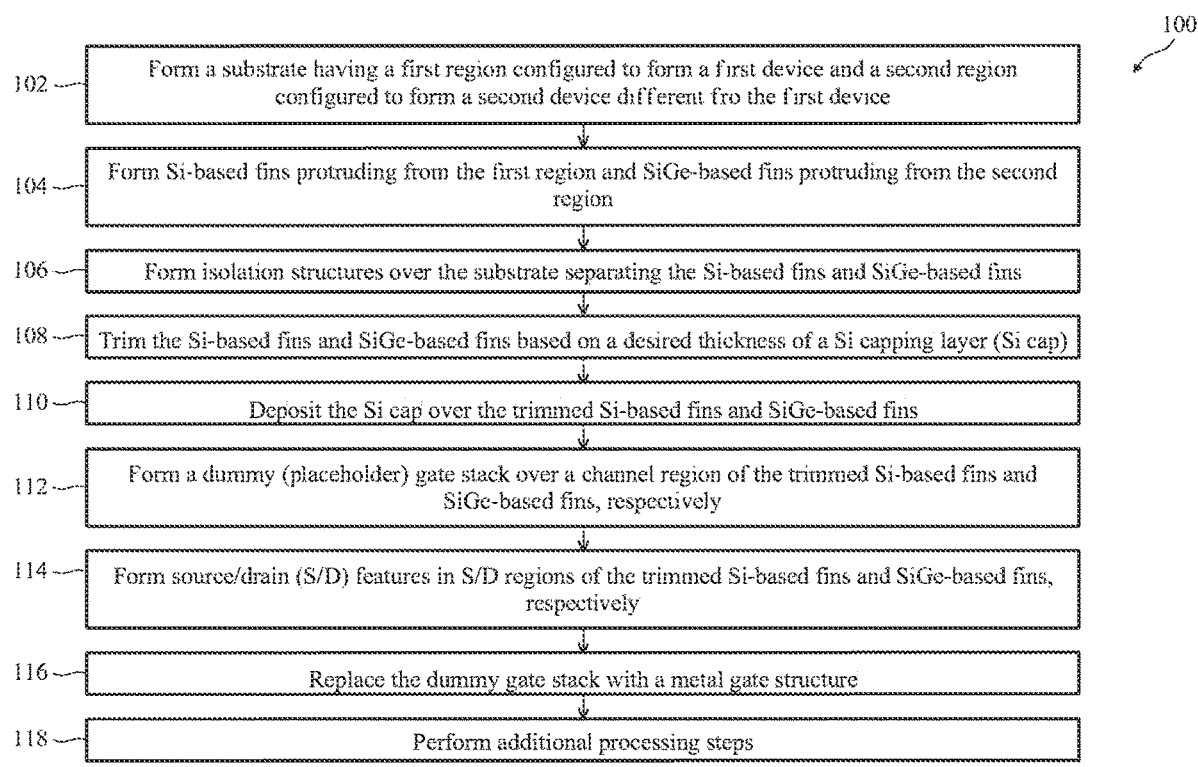
FIGS. 1A and 1B together illustrate a flow chart of a method for forming a semiconductor structure or a portion thereof according to aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices and fabrication methods, and more particularly to three-dimensional field-effect transistors (FETs), such as fin-like FETs (FinFETs), gate-all-around FETs (GAA FETs), and/or other FETs.

Various methods have been developed to improve performance of three-dimensional FETs. One example method is directed to incorporating silicon germanium (SiGe)-based channel in an FET to address challenges such as tuning threshold voltage ($V_t$) at reduced length scales. While such method has been generally adequate, it is not entirely satisfactory in all aspects. For example, compared to silicon (Si), SiGe is more susceptible to oxidation reaction during device fabrication process, consequently producing germanium oxide (GeOx) that would adversely affect performance of the device. Therefore, for at least this reason, improvements in processing SiGe-based channel in FETs are desired.

Figure 1B:
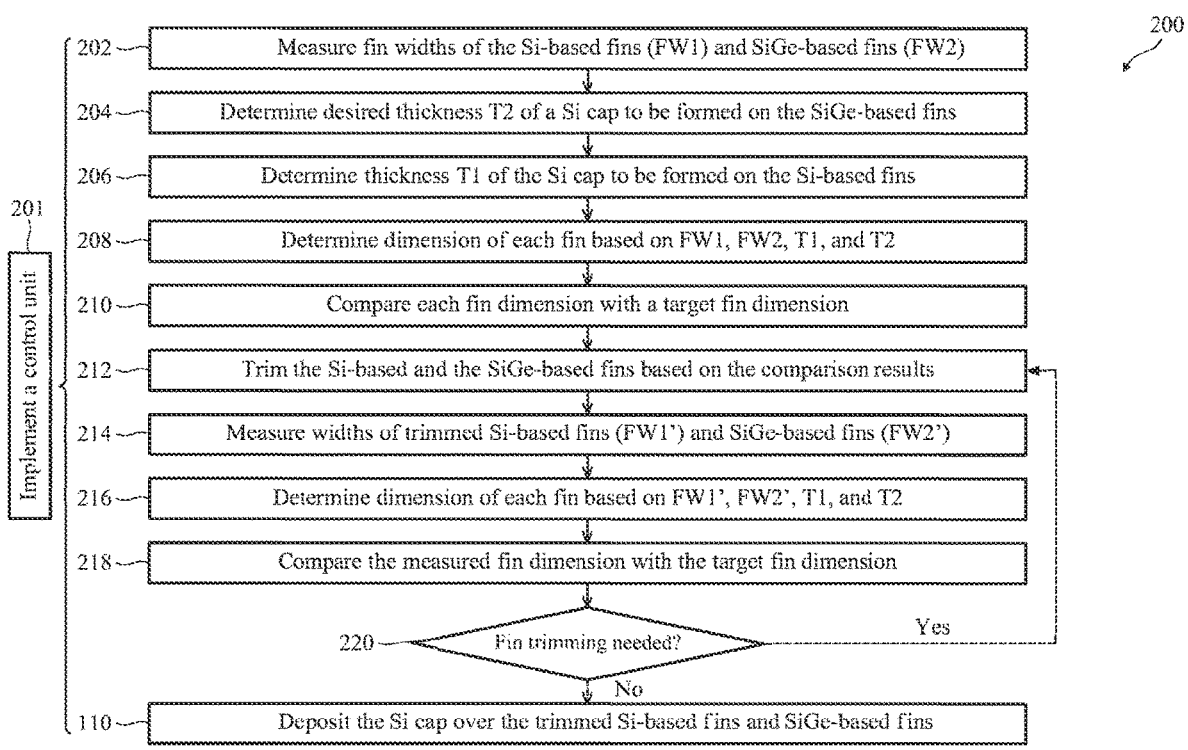

FIGS. 1A and 1B together illustrate processing flow of a method 100 for forming a device 10 in accordance with embodiments of the present disclosure. The method 100 is merely an example and is not intended to limit the present disclosure beyond what is explicitly recited in the claims. Additional operations can be performed before, during, and after the method 100, and some operations described herein can be replaced, eliminated, or moved around to provide additional embodiments of the method 100. The method 100 is described below in conjunction with FIGS. 2 to 15B.

The device 10 may be an intermediate device fabricated during processing of an IC, or a portion thereof, that may include static random-access memory (SRAM) and/or other logic circuits, passive components such as resistors, capacitors, and inductors, and active components such as p-type FETs (PFETs), n-type FETs (NFETs), FinFETs, multi-gate FETs (e.g., gate-all-around, or GAA, FETs), metal-oxide semiconductor field effect transistors (MOSFETs), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. Additional features can be added to the device 10, and some of the features described below can be replaced, modified, or eliminated in other embodiments of the device 10.

Figure 2:
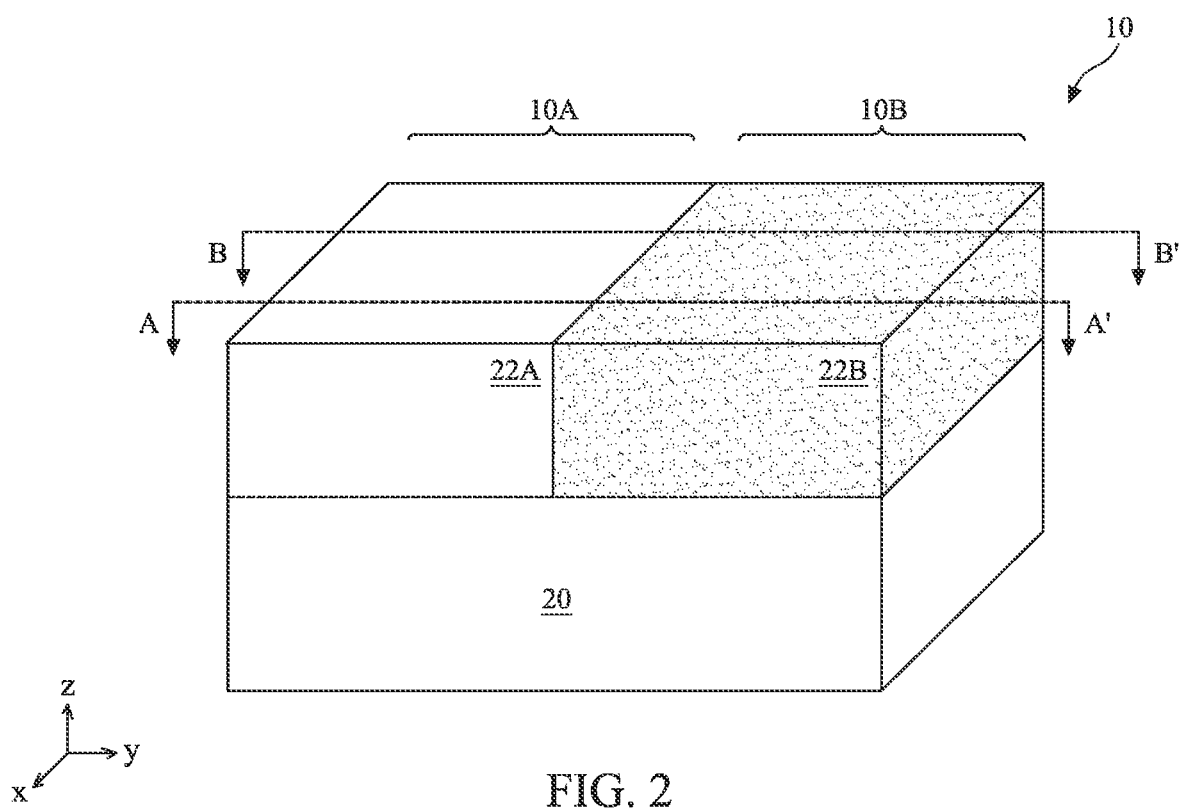
FIG. 2 shows a three-dimensional perspective view of a semiconductor structure implemented with an embodiment of the method of FIGS. 1A and 1B according to aspects of the present disclosure.

At operation 102, referring to FIGS. 1A and 2, the method 100 provides, or is provided with, the device 10 that includes a substrate 20 having a device region 10A and a device region 10B disposed thereon and configured to provide FETs of different conductivity types. For example, the device region 10A may be configured to provide at least one NFET and the device region 10B may be configured to provide at least one PFET. It is noted, however, that the device region 10A and the device region 10B may not be disposed immediately adjacent to each other as depicted in the present embodiments. The device 10 may include numerous other features such as, for example, hard mask layers, etch-stop layers, barrier layers, other suitable layers, or combinations thereof. For purpose of simplicity, intermediate steps of the method 100 are hereafter described with reference to FIGS. 3-15B; of which, FIGS. 3-9B are cross-sectional views taken through either a source/drain (S/D) region or a channel region of the device 10, i.e., along the line A-A' or line B-B' depicted in FIG. 2, FIGS. 10A, 11A, 12A, 13A, 14A, and 15A are cross-sectional views taken through the S/D region of the device 10, and FIGS. 10B, 11B, 12B, 13B, 14B, and 15B are cross-sectional views taken through the channel region of the device 10.

The substrate 20 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 20 may be a single-layer material having a uniform composition. Alternatively, the substrate 20 may include multiple material layers having similar or different compositions suitable for IC device manufacturing. In one example, the substrate 20 may be a silicon-on-insulator (SOI) substrate having a silicon layer formed on a silicon oxide layer.

In the present embodiments, the substrate 20 includes silicon, such as elemental silicon. As depicted in FIG. 2, the device region 10A and the device region 10B are formed over the substrate 20, where the device region 10A is provided in and/or over a layer 22A and the device region 10B is provided in and/or over a layer 22B, both of which are formed over the substrate 20. In the present embodiments, referring to FIG. 2A, the layers 22A and 22B have different compositions, e.g., the layer 22A includes silicon, such as elemental silicon, and the layer 22B includes silicon germanium (SiGe). The layers 22A and 22B may be epitaxially grown over the substrate 20 by one or more selective epitaxial growth (SEG) process including chemical vapor deposition (CVD) processes (e.g., vapor-phase epitaxy (VPE), ultra-high vacuum CVD (UHV-CVD), low-pressure CVD (LP-CVD), plasma-enhanced (PE-CVD), other suitable CVD processes, or combinations thereof), molecular beam epitaxy (MBE), other suitable SEG processes, or combinations thereof. The layers 22A and 22B may be grown epitaxially using gaseous and/or liquid precursors, which interact with the composition of the underlying substrate, i.e., the substrate 20.

Figure 3:
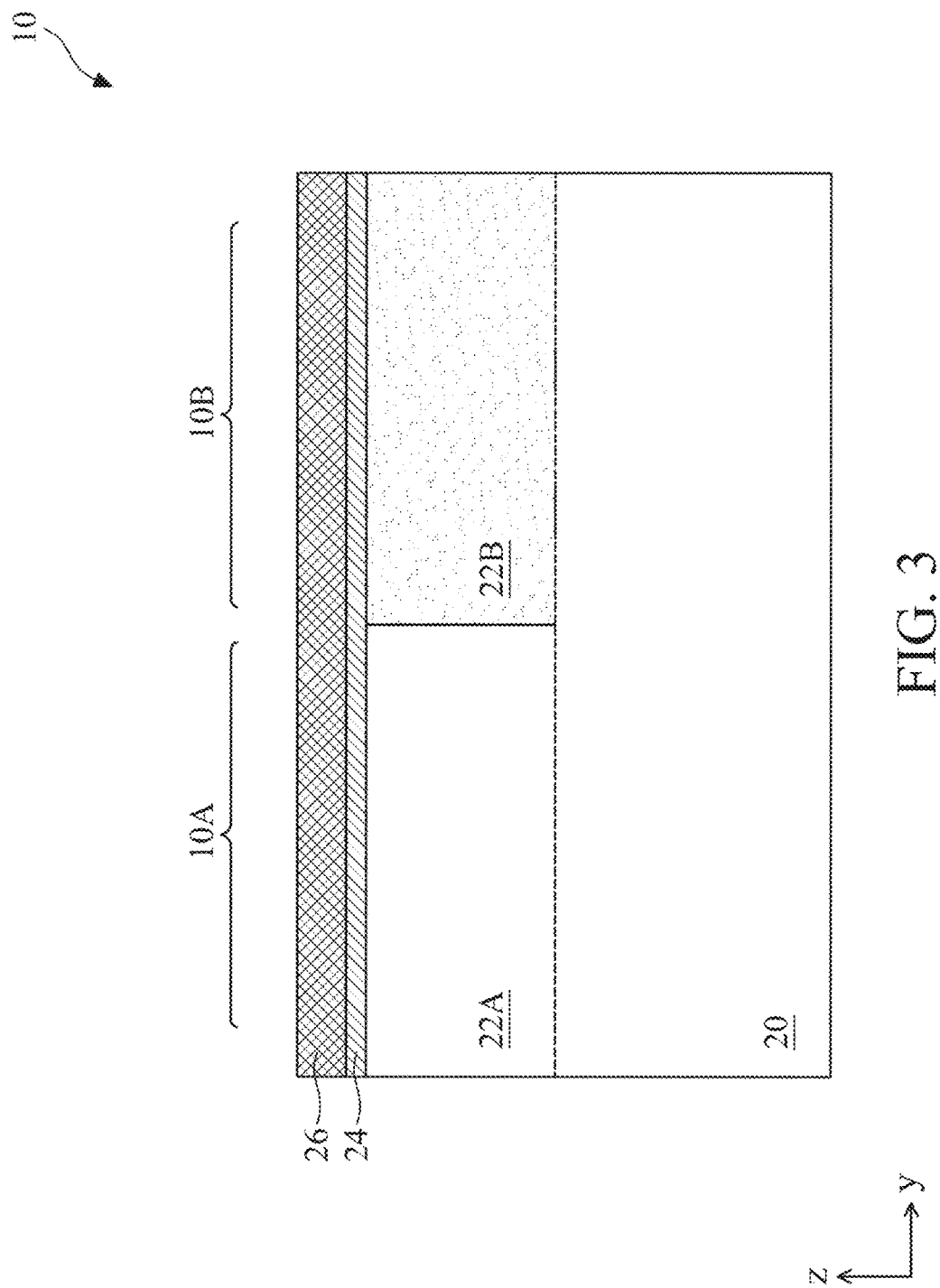
FIGS. 3, 4A, 4B, 5, 6, 7A, 7B, 8, 9A, and 9B show cross-sectional views of the semiconductor structure of FIG. 2 taken along line A-A' or line B-B' during intermediate steps of implementing an embodiment of the method of FIGS. 1A and 1B according to aspects of the present disclosure.
Figure 4A:
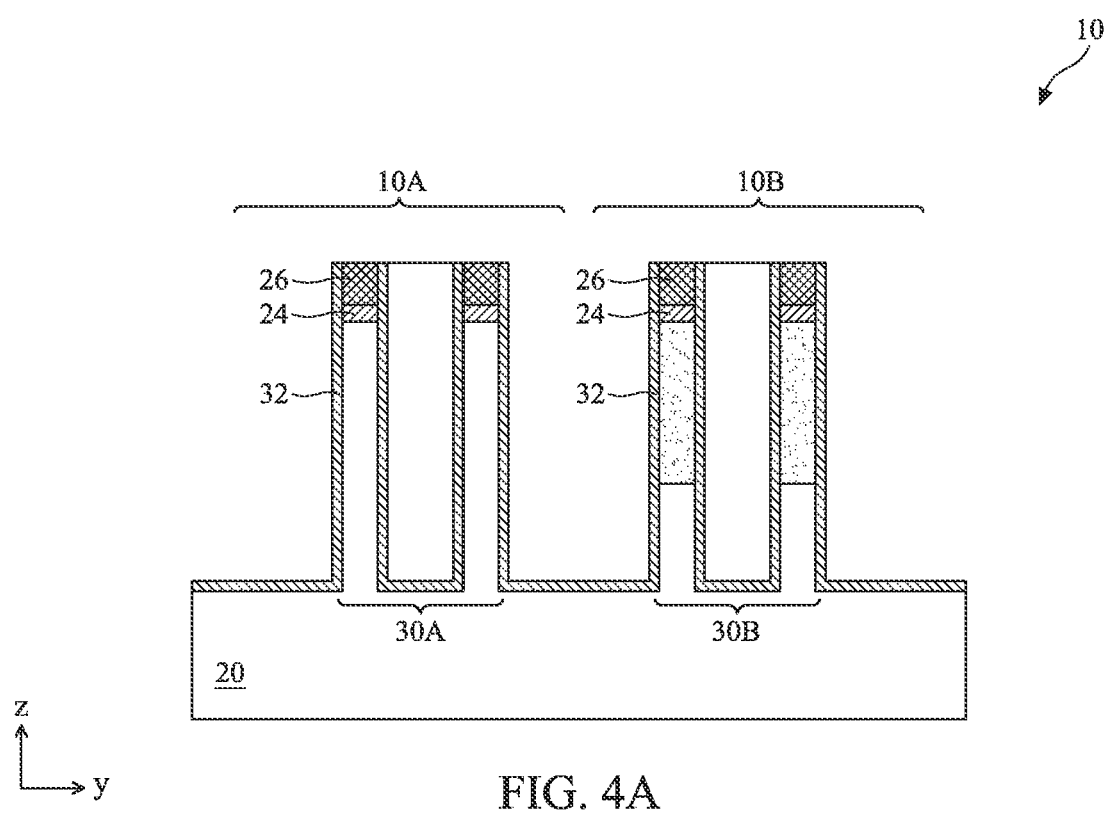
Figure 4B:
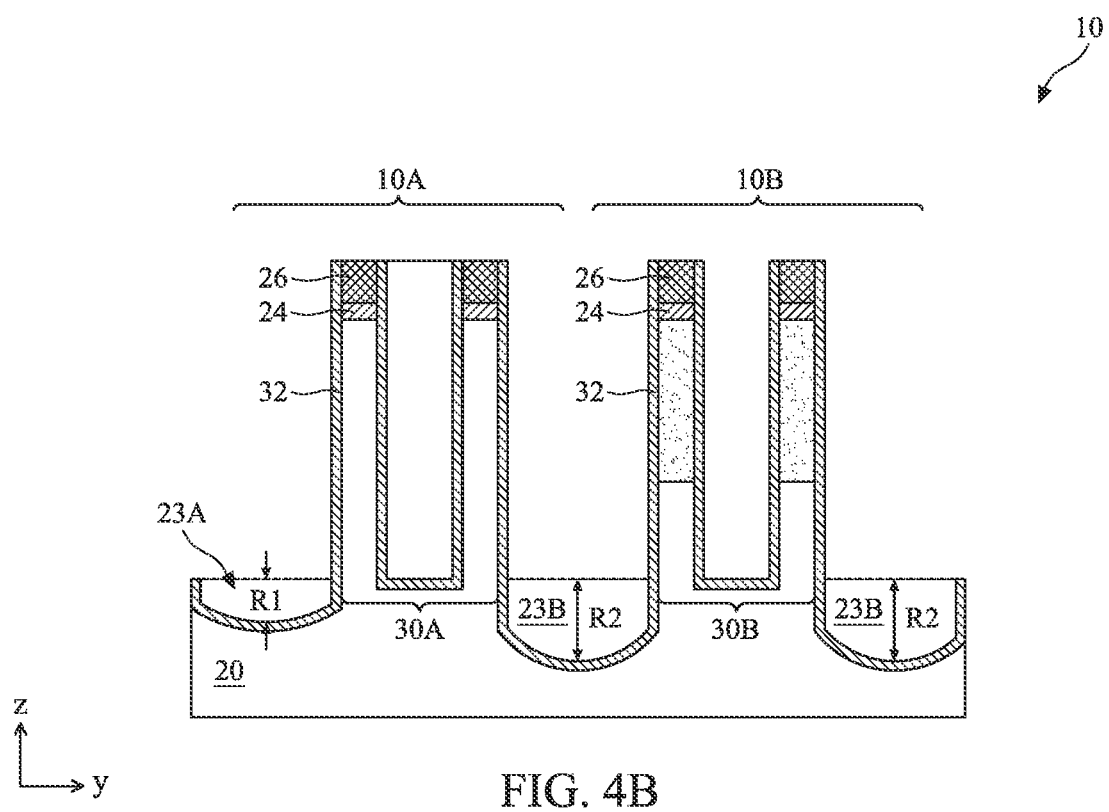

Referring to FIGS. 3, 4A, and 4B, the method 100 at operation 104 forms the first fins 30A and the second fins 30B from the layers 22A and 22B, respectively. In the present embodiments, the first fins 30A and the second fins 30B are configured to form FETs of different conductivity types. In the present disclosure, due to the difference in composition between the layers 22A and 22B, the first fins 30A may alternatively be referred to as Si-based fins 30A and the second fins 30B may alternatively be referred to as SiGe-based fins 30B. As depicted in FIG. 3, which is a side view of the device 10 shown in the YZ plane, before forming the first fins 30A and the second fins 30B, hard mask layers 24 and 26 are deposited over the layers 22A and 22B. The hard mask layers 24 and 26 may each include any suitable dielectric material, such as silicon oxide, silicon nitride, carbon- and/or oxygen-doped silicon nitride, silicon carbide, oxygen-doped silicon carbide, other suitable dielectric materials, or combinations thereof. In the present embodiments, the hard mask layer 24 includes an oxide-containing material, such as silicon oxide, and the hard mask layer 26 includes a nitride-containing material, such as silicon nitride. The hard mask layers 24 and 26 are configured to protect the underlying components of the device 10 from being inadvertently etched during the subsequent fin-formation processes.

Referring to FIG. 4A, the first fins 30A and the second fins 30B may be fabricated from the layers 22A and 22B, respectively, by using suitable processes including photolithography and etch processes. The photolithography process may include forming a photoresist layer (resist) overlying the layers 22A and 22B, exposing the resist to a pattern, performing post-exposure bake processes, and developing the resist to form a masking element (not shown) including the resist. The masking element is then used for etching recesses in the layers 22A and 22B, leaving the first fins 30A and the second fins 30B protruding from the substrate 20. The etching process may include dry etching, wet etching, reactive ion etching (RIE), other suitable processes, or combinations thereof. After performing the etching process, portions of the hard mask layers 24 and 26 remain over the first fins 30A and the second fins 30B, thereby protecting the fins from subsequent fabrication processes.

Numerous other embodiments of methods for forming the first fins 30A and the second fins 30B may be suitable. For example, the first fins 30A and the second fins 30B may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 20 and patterned using a photolithography process. Spacers are formed alongside the patterned sacrificial layer using a self-aligned process. The sacrificial layer is then removed, and the remaining spacers, or mandrels, may then be used to pattern the first fins 30A and the second fins 30B.

In the present embodiments, two fins are formed in each of the device region 10A and the device region 10B. It is noted, however, that the present embodiments are not limited to such configurations. For example, each of the device region 10A and the device region 10B may include only one fin or more than two fins as suitable for desired design requirements. In some embodiments, as depicted in FIG. 4B, patterning the layers 22A and 22B removes portions of the substrate 20 to form recesses 23A and 23B. The recesses 23A and 23B may be defined by a depth R1 and a depth R2, respectively, where R1 may be different from R2. For example, in the depicted embodiments, R1 is less than R2. Of course, the present embodiments are not limited to this configuration.

Subsequently, still referring to FIG. 4A, a dielectric liner 32 is formed on sidewalls of the first fins 30A and the second fins 30B and over the substrate 20. The dielectric liner 32 may include silicon oxide, silicon nitride, other suitable materials, or combinations thereof. In the present embodiments, the dielectric liner 32 is formed by conformally depositing one or more dielectric material discussed above over the device 10 by a method including chemical vapor deposition (CVD), atomic layer deposition (ALD), other suitable methods, or combinations thereof. In some embodiments, the dielectric liner 32 is omitted from the device 10. For the embodiment depicted in FIG. 4B, portions of the dielectric liner 32 are deposited in the recesses 23A and 23B. For illustrative purposes, however, subsequent operations of the method 100 are discussed with reference to the embodiment depicted in FIG. 4A.

Figure 5:
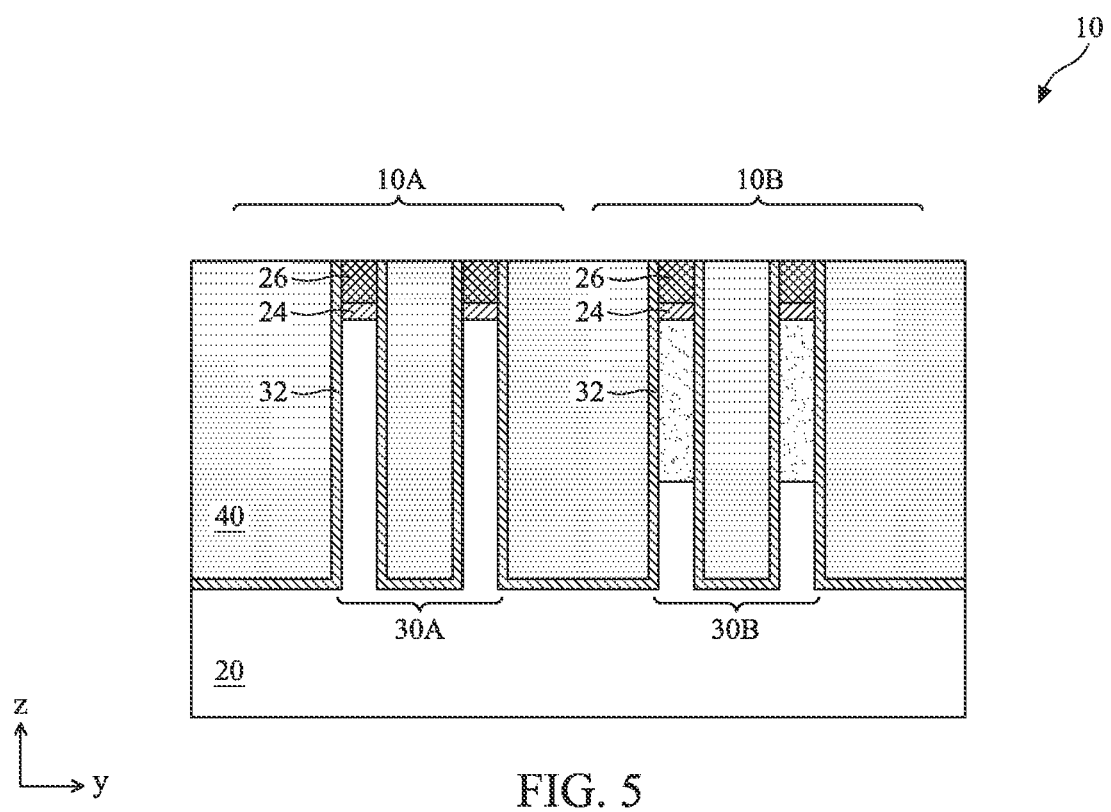
Figure 6:
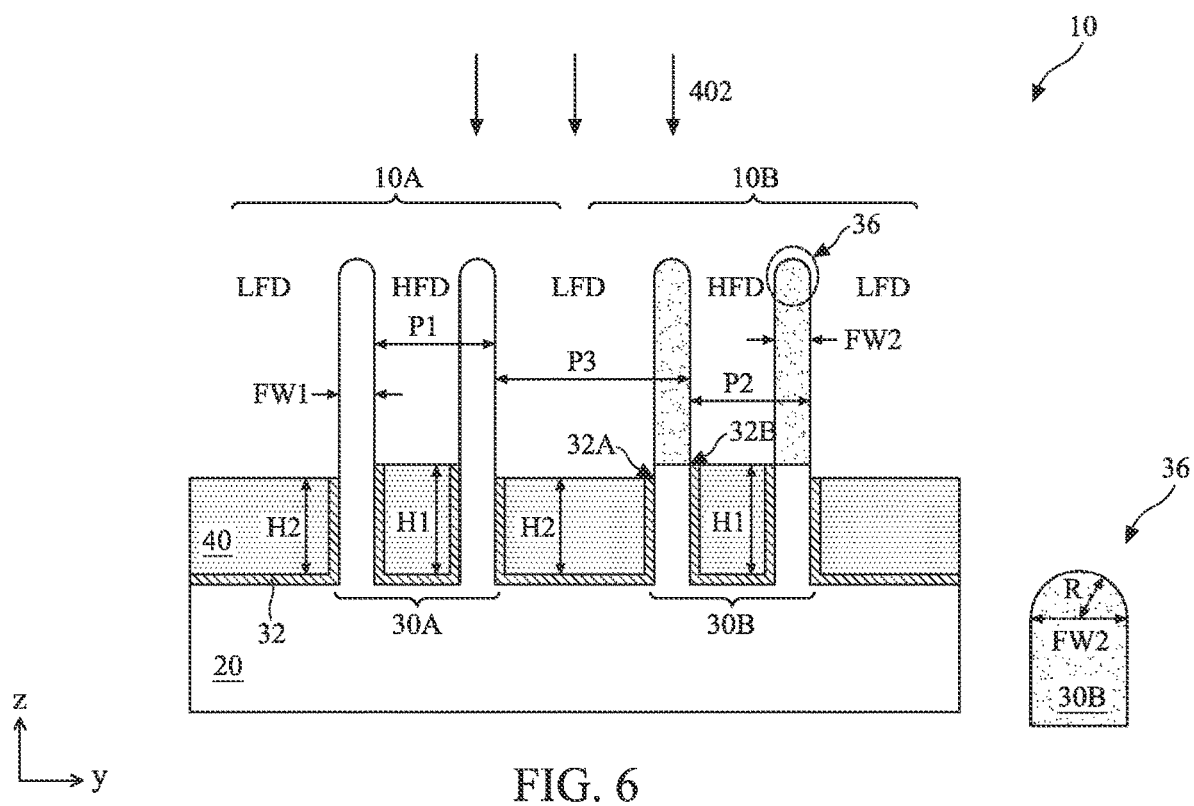

Referring to FIGS. 5 and 6, the method 100 at operation 106 forms isolation structures 40 over the substrate 20, thereby separating various components (e.g., the first fins 30A, the second fins 30B, etc.) of the device 10. In the present embodiments, referring to FIG. 5, the method 100 first forms the isolation structures 40 over the device 10, thereby filling trenches that separate the first fins 30A and the second fins 30B. The isolation structures 40 may include silicon dioxide, a low-k dielectric material, other suitable materials, or combinations thereof. The isolation structures 40 may be deposited by any suitable method, such as CVD, flowable CVD (FCVD), spin-on-glass (SOG), other suitable methods, or combinations thereof. In some embodiments, the composition of the dielectric liner 32 is substantially the same as that of the isolation structures 40. For example, the dielectric liner 32 and the isolation structures 40 may both include silicon oxide. In some embodiments, the composition of the dielectric liner 32 is different from that of the isolation structures 40. For example, the dielectric liner 32 may include silicon nitride and the isolation structures 40 may include silicon oxide. The isolation structures 40 may include shallow trench isolation (STI) features. Other isolation structures such as field oxide, local oxidation of silicon (LOCOS), other suitable structures, or combinations thereof may also be implemented as the isolation structures 40. The isolation structures 40 may include a single-layer structure or, alternatively, a multi-layer structure having, for example, one or more thermal oxide layers.

The method 100 then performs one or more chemical mechanical planarization (CMP) process to remove top portions of the isolation structures 40. In some embodiments, the CMP process(es) removes the hard mask layers 24 and 26 from top surfaces of the first fins 30A and the second fins 30B. Subsequently, referring to FIG. 6, the method 100 performs an etching process 402 to recess the isolation structures 40, such that a top surface of the isolation structures 40 is below top surfaces of the first fins 30A and the second fins 30B.

In the present embodiments, the etching process 402 removes portions of the dielectric liner 32 when recessing the isolation structures 40. For embodiments in which the isolation structures 40 and the dielectric liner 32 have the same composition (e.g., both including silicon oxide), a height of the resulting dielectric liner 32 is substantially similar to a thickness of the isolation structures 40. For embodiments in which the isolation structures 40 and the dielectric liner 32 have different compositions (e.g., the isolation structures 40 include silicon oxide and the dielectric liner 32 includes silicon nitride), the height of the resulting dielectric liner 32 is different from the thickness of the isolation structures 40, and such difference may depend on difference in etching rate between the two compositions when subjected to a common etchant.

In the present embodiments, the device 10 includes regions of varying fin densities, i.e., the separation distance between adjacent fins varies depending on the number of fins present in a given device region. For example, as depicted in FIG. 6, neighboring first fins 30A formed in the device region 10A may be separated by a pitch P1, neighboring second fins 30B formed in the device region 10B may be separated by a pitch P2, and a first fin 30A may be separated from a neighboring second fin 30B by a pitch P3, where P3 is greater than P1 and P2. In other words, the region of the device 10 disposed between the two first fins 30A and the region of the device 10 disposed between the two second fins 30B are considered higher-fin-density, or HFD, regions, while the region of the device 10 disposed between the first fin 30A and its neighboring second fin 30B is considered a lower-fin-density, or LFD, region. In some embodiments, differences in fin densities leads to differences in the amount of the isolation structures 40 removed at operation 106. For example, the isolation structures 40 may be recessed more in the LFD region than in the HFD region due to more etchant loading between sparsely disposed fins. Because removing portions of the isolation structures 40 also removes portions of the dielectric liner 32, the dielectric liner 32 on opposite sidewalls of each of the first fins 30A and the second fins 30B may have different heights. For example, the dielectric liner 32A disposed in the HFD region is defined by a height H1 and the dielectric liner 32B disposed in the LFD region has a height H2, where H1 is greater than H2.

Generally, SiGe-based fins, such as the second fins 30B provided herein, may be prone to oxidation at various stages of FinFET fabrication, producing germanium oxide (GeOx) that degrades device performance. To address this issue, a silicon capping layer (hereafter referred to as a Si cap, such as Si cap 34 discussed in detail below) may be deposited over the SiGe-based fins to prevent inadvertent oxidation. While this practice has been generally adequate, it has not been entirely satisfactory in all aspects. For example, depositing a Si cap may lead to enlargement of critical dimension (CD) or width of the SiGe-based fins (and fins of other materials or conductivity type disposed on the same substrate), potentially leading to occurrence of drain-induced barrier lowering (DIBL) phenomenon. The present disclosure provides methods of trimming SiGe-based fins (for forming PMOS devices) and Si-based fins (for forming NMOS devices) before forming the Si cap thereover to meet desired CDs of the fins to improve the resulting device performance.

Figure 7A:
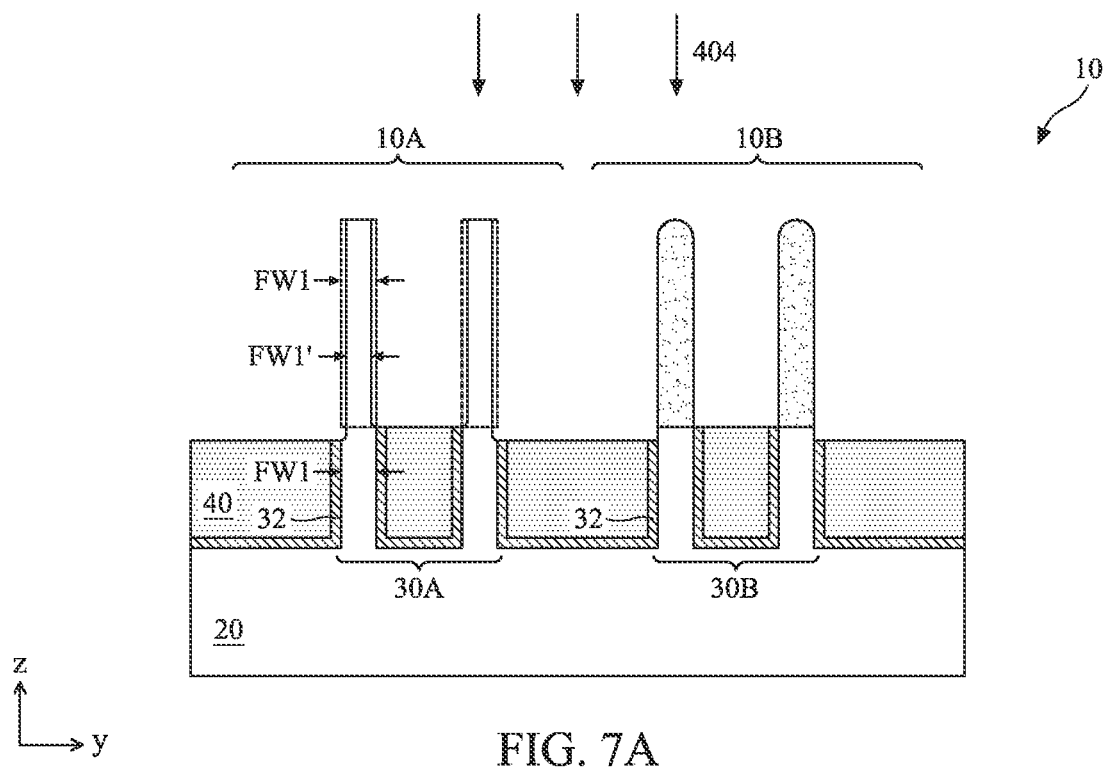
Figure 7B:
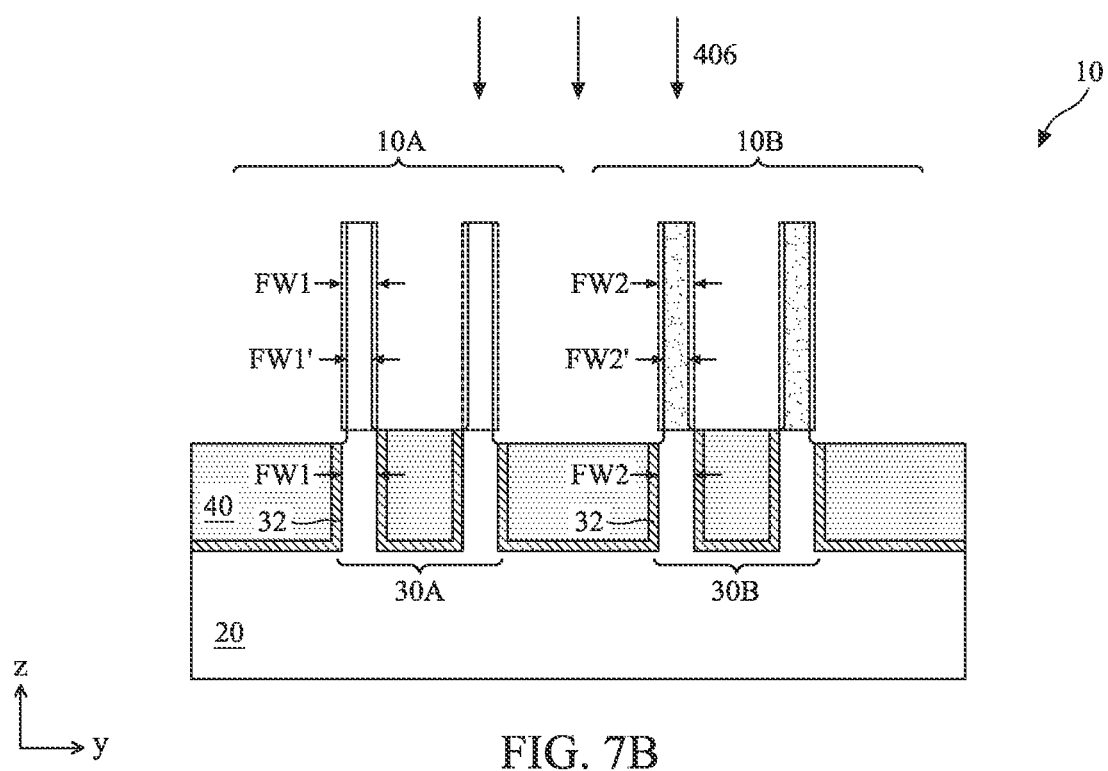

Now referring to FIGS. 7A and 7B, the method 100 at operation 108 trims the width of each of the first fins 30A and the second fins 30B before depositing the Si cap 34. In the present embodiments, the trimming process includes operations 202 to 220 of method 200 as depicted in FIG. 1B. In some embodiments, the method 200 is implemented by a control unit 201 configured to electrically and signally control and/or communicate with various tools. In some embodiments, the control unit 201 includes a computer readable medium having hard drives, flash drives, CD-ROMs, RAM memory, display devices (e.g., monitors), input/output device (e.g., mouse and keyboard), and the like integrated together. The control unit 201 may implement a series of software instructions written in any suitable programming language and designed to implement various operations of the method 200 including, for example, measuring fin widths (or fin CDs), determining a thickness of the Si cap 34 to be deposited, computing various parameters based on the measured fin widths, determining whether fin trimming is needed, trimming the fins, feedback actions necessitated based on the trimming, and/or other suitable operations. In some embodiments, each of the operations 202 to 220 includes a processor operable to perform instructions read from the computer readable medium of the control unit 201 with software instructions encoded thereon. In some embodiments, the control unit 201 and the various tools together form an advanced process control (APC) system to automatically process the first fins 30A and the second fins 30B before depositing the Si cap 34.

The method 200 at operation 202 measures a fin width FW1 of each first fin 30A and a fin width FW2 of each second fin 30B as depicted in FIGS. 6, 7A, and 7B. The fin width FW1 and the fin width FW2 may be different or substantially the same in magnitude depending on specific design requirements. In some embodiments, the fin width FW1 and the fin width FW2 vary vertically along a height of each fin, i.e., sidewalls of each fin may be slanted. As such, the fin widths FW1 and FW2 may each be determined at a portion away from the top and the bottom surfaces of each fin, e.g., at approximately half of the fin's step height, which corresponds to the height of each fin protruding measured from the isolation structures 40. Alternatively, the fin widths FW1 and FW2 may each be determined by averaging the fin width at various positions along the height of each fin. In some examples, as depicted in an enlarged view of portion 36 of the second fins 30B in FIG. 6, the etching process 402 may slightly remove portions of the second fins 30B, resulting in the topmost portion of the second fins 30B having an approximately hemispherical shape with a radius R, where R may be less than or equal to half of the fin width FW2. Though not depicted, similar geometry may also be applicable to one or more of the first fins 30A. In some embodiments, the fin widths FW1 and FW2 are determined by using an optical measurement method, such as critical dimension scanning electron microscopy (CDSEM), optical critical dimension (OCD) spectroscopy, other suitable measurement methods, or combinations thereof.

At operation 204, the method 200 determines a thickness T2 of the Si cap 34 to be deposited over the second fins 30B. In the present embodiments, the thickness T2 is determined based on a level of protection desired for the second fins 30B against oxidation reaction without excessively enlarging the resulting fin width (or fin CD) of the second fins 30B. In other words, the Si cap 34 is formed to a minimum thickness while offering adequate protection for the underlying second fins 30B. In some examples, the thickness T2 may be about 0.7 nm to about 0.8 nm.

Subsequently, the method 200 at operation 206 determines a thickness T1 of the Si cap 34 to be formed over the first fins 30A. In the present embodiments, although the Si cap 34 is formed globally over the device 10, i.e., over both the device region 10A and the device region 10B, the rate of Si growth on Si (i.e., the first fins 30A) is different from that on SiGe (i.e., the second fins 30B) due to difference in incubation period of the Si growth process. Generally, the incubation period of Si growth is shorter on SiGe than on Si. Accordingly, the rate of Si growth on SiGe is greater than that on the Si, resulting in the thickness T2 being greater than T1 given the same amount of deposition time. In some examples, a ratio of the thickness T2 to the thickness T1 may be about 1.1 to about 1.8. In the present embodiments, the control unit 201 includes suitable computation equipment configured to estimate the thickness T1 based on the desired thickness T2 and a known difference in the rate of Si growth between the first fins 30A and the second fins 30B.

At operation 208, the method 200 determines a projected fin dimension (or projected fin CD) based on the measured fin widths and the thickness of the Si cap 34 to be deposited. In the present embodiments, the projected fin dimension CD1 of each first fin 30A is determined based on the measured fin width FW1 and the thickness T1, i.e., CD1=2*T1+FW1, and the projected fin dimension CD2 of each second fin 30B is determined based on the measured fin width FW2 and the thickness T2, i.e., CD2=2*T2+FW2. Subsequently, the method 200 at operation 210 compares the projected fin dimensions CD1 and CD2 with a desired or target fin dimension $CD1_T$ of the first fins 30A and a target fin dimension $CD2_T$ of the second fins 30B, respectively. In the present embodiments, the CD1r accounts for a trimmed fin width FW1' of the first fin 30A and the thickness T1 of the Si cap 34 deposited thereon and the CD2r accounts for a trimmed fin width FW2' of the second fin 30B and the thickness T2 of the Si cap 34 deposited thereon. While the present embodiments do not limit the target fin dimensions to specific values, it is noted that the projected fin dimensions are generally larger than the target fin dimensions due to the added thickness of the Si cap 34. As such, the method 200 at operation 210 obtains a numeric difference between CD1 and CD1r and a numeric difference between CD2 and $CD2_T$, where both numeric differences are positive values. In the present embodiments, subsequent trimming process(es) of the method 200 is implemented to ensure that the target fin dimensions $CD1_T$ and $CD2_T$ are substantially the same as FW1 and FW2, respectively, which are measured at operation 202.

Still referring to FIGS. 7A and 7B, the method 200 at operation 212 proceeds to trimming the first fins 30A and the second fins 30B based on the comparison results obtained at operation 210. As discussed above, because the composition of the first fins 30A is different from that of the second fins 30B, subjecting the first fins 30A and the second fins 30B to a common etchant may not be suitable for achieving the desired trimming results. While existing methods of trimming fins have been generally adequate, they have not been entirely satisfactory in all aspects. For example, some methods may involve trimming the first fins 30A and the second fins 30B separately using lithography masks to protect the fins not being trimmed, which may inadvertently increase the production complexity and cost. In the present embodiments, however, the method 200 implements an etching process 404 (FIG. 7A) to selectively etch the first fins 30A and an etching process 406 (FIG. 7B) to selectively etch the second fins 30B. In some examples, an etching selectivity (i.e., a ratio of the etching rates) of the first fins 30A with respect to the second fins 30B during the etching process 404 and an etching selectivity of the second fins 30B with respect to the first fins 30A during the etching process 406 may be at least about 5:1. In some embodiments, a dry ashing process is implemented after the etching processes 404 and 406 to remove any etching by-products from the device 10.

Because each of the trimming processes is selective to etch fins of different compositions, the method 200 does not require a specific order in which the etching processes 404 and 406 are performed and the fins are exposed together to each etching process. For example, the method 200 may perform the etching process 404 before performing the etching process 406 as depicted in FIGS. 7A and 7B; alternatively, the method 200 may perform the etching process 406 before performing the etching process 404.

In the present embodiments, the etching process 404 is a wet etching process that utilizes an etchant including a metal hydroxide ($M^{n+}(OH^-)_n$), an amine derivative, other suitable reagents, or combinations thereof. The metal hydroxide may include NaOH, KOH, LiOH, RbOH, CsOH, other suitable metal hydroxides, or mixtures thereof. The amine derivative may include ammonia, tetramethylammonium hydroxide (TMAH), tetraethylammonium hydroxide (TEAH), tetradecyltrimethylammonium hydroxide (TTAH), tetrabutylammonium hydroxide (TBAH), other suitable amine derivative, or combinations thereof. Ionic surfactants such as quaternary ammonium ($-R_4N^+$), sulfate ($-OSO_3^-$), sulfonate ($-SO_3^-$), phosphate, carboxylates ($-COO^-$) derivatives or nonionic surfactants such as alcohol ethoxylates, alkyl phenol ethoxylates, fatty acid ethoxylates, fatty amine ethoxylates, glycol esters, glycerol esters, or combinations thereof may be added to reduce the surface tension of the etchant.

In the present embodiments, the etching process 406 is a wet etching process that utilizes an etchant including a metal hydroxide, an amine derivative, a combination thereof, one or more ionic surfactant, as well as an oxidant. The metal hydroxide, the amine derivative, and the ionic surfactant may be similar to those provided above with respect to the etching process 404. In the present embodiments, the oxidant, which is absent in the etchant utilized for the etching process 404, includes ozone dissolved in deionized water, hydrogen peroxide ($H_2O_2$), or a combination thereof.

During the etching process 406, the oxidant is configured to oxidize SiGe in the second fins 30B, and the resulting oxidized SiGe and/or germanium oxide are subsequently etched by the metal hydroxide(s) and/or the amine derivative(s), which do not substantially attack unoxidized second fins 30B. While the oxidant may also oxidize Si in the first fins 30A, such reaction is much slower than the oxidation of SiGe and/or Ge, and any silicon oxide formed by the oxidant is generally not etched by the metal hydroxide(s) and/or amine derivative(s) provided herein. Accordingly, in the present embodiments, the addition of the oxidant enhances the selective etching of the second fins 30B with respect to the first fins 30A. In some embodiments, the oxidant is mixed with the metal hydroxide(s) and/or the amine derivative(s) during the etching process 406. In some embodiments, the oxidant is applied to the device 10 before applying the metal hydroxide and/or the amine derivative, such that the oxidant oxidizes the second fins 30B first to form oxidized SiGe and/or germanium oxide and the metal hydroxide(s) and/or the amine derivative(s) subsequently removes such oxidized products as well as portions of the first fins 30A. For embodiments in which any silicon oxide is formed during the etching process 406, a wet etching process may be performed after both the first fins 30A and the second fins 30B are trimmed, where the wet etching process utilizes an etchant selective to remove silicon oxide from the first fins 30A but not SiGe from the second fins 30B or unoxidized Si from the first fins 30A.

Various etching parameters may be adjusted to fine-tune the etching process 404 and/or the etching process 406. For example, increasing concentration of the etchant of a given etching process may increase the rate at which the fins are removed. Therefore, the concentration of each etchant for removing the first fins 30A and the second fins 30B is proportional to the numeric differences ($CD1-CD1_T$) and ($CD2-CD2_T$), respectively. In some embodiments, due to the effects of etchant loading being different between the LFD regions and the HFD regions as discussed above with respect to FIG. 6, the amount of material removed by the etching processes 404 and 406 differs between opposite sidewalls of a fin (e.g., an first fin 30A or a second fin 30B), resulting in asymmetric structures at a bottom portion of the fin in contact with the isolation structures 40 (discussed in detail below with respect to FIGS. 9A and 9B).

Subsequently, the method 200 at operation 214 measures the trimmed fin width FW1' of the first fins 30A and the trimmed fin width FW2' of the second fins 30B in manners similar to those discussed with respect to operation 202. Based on the trimmed fin widths FW1' and FW2', as well as the projected thickness T1 and T2 of the Si cap 34 obtained at operations 204 and 206, respectively, the method 200 at operation 216 determines a trimmed fin dimension CD1' for the first fin 30A and a trimmed fin dimension CD2' for the second fin 30B, where CD1'=2*T1+FW1' and CD2'=2*T2+FW2'. In some examples, CD1' and CD2' may each be about 5 nm to about 10 nm, and T1 and T2 may each be about 0.5 nm to about 3 nm (e.g., T2 may be about 0.7 nm to about 0.8 nm as discussed above). Accordingly, a ratio of T1 to CD1' and of T2 to CD2' may each be about 0.05 to about 0.6. Similar to operation 210 discussed above, the method 200 at operation 218 compares the trimmed fin dimensions with their respective target fin dimension, i.e., comparing CD1' with $CD1_T$ and comparing CD2' with $CD2_T$. In the present embodiments, the control unit 201 at operation 220 determines whether the method 200 repeats operations 212 through 218 and continues the trimming of the first fins 30A and/or the second fins 30B or proceeds to depositing the Si cap 34 over the trimmed first fins 30A and the trimmed second fins 30B at operation 110 as depicted in FIG. 1A. In the present embodiments, if CD1' is greater than CD1r and/or if CD2' is greater than $CD2_T$, the trimming process is repeated and the trimmed fin dimension(s) are measured and compared as discussed above until the trimmed fin dimensions CD1' and CD2' are less than or equal to the target fin dimensions $CD1_T$ and $CD2_T$, respectively. Accordingly, the present disclosure provides methods suitable for fine-tuning the dimensions of Si-based fins and SiGe-based fins by a series of measuring, trimming, and adjusting processes, taking into account the thickness (e.g., T1 and T2) of the Si cap 34 to be deposited over the Si-based fins and the SiGe-based fins.

Figure 8:
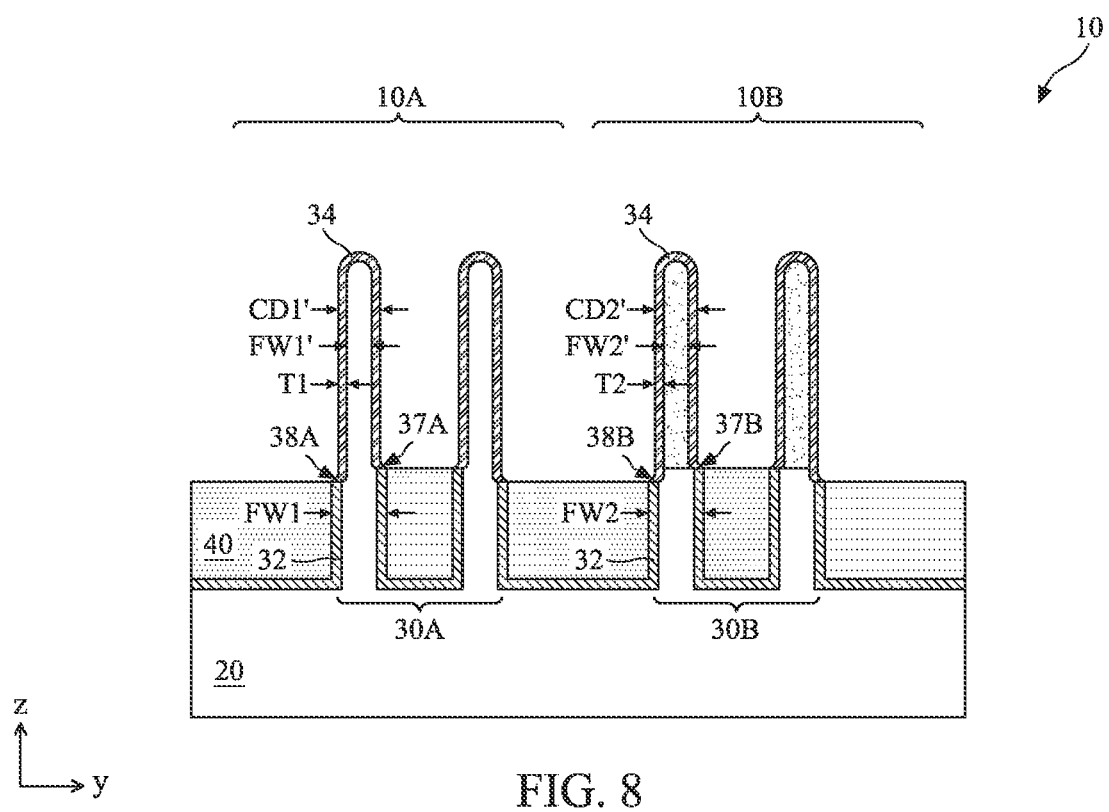
Figure 9A:
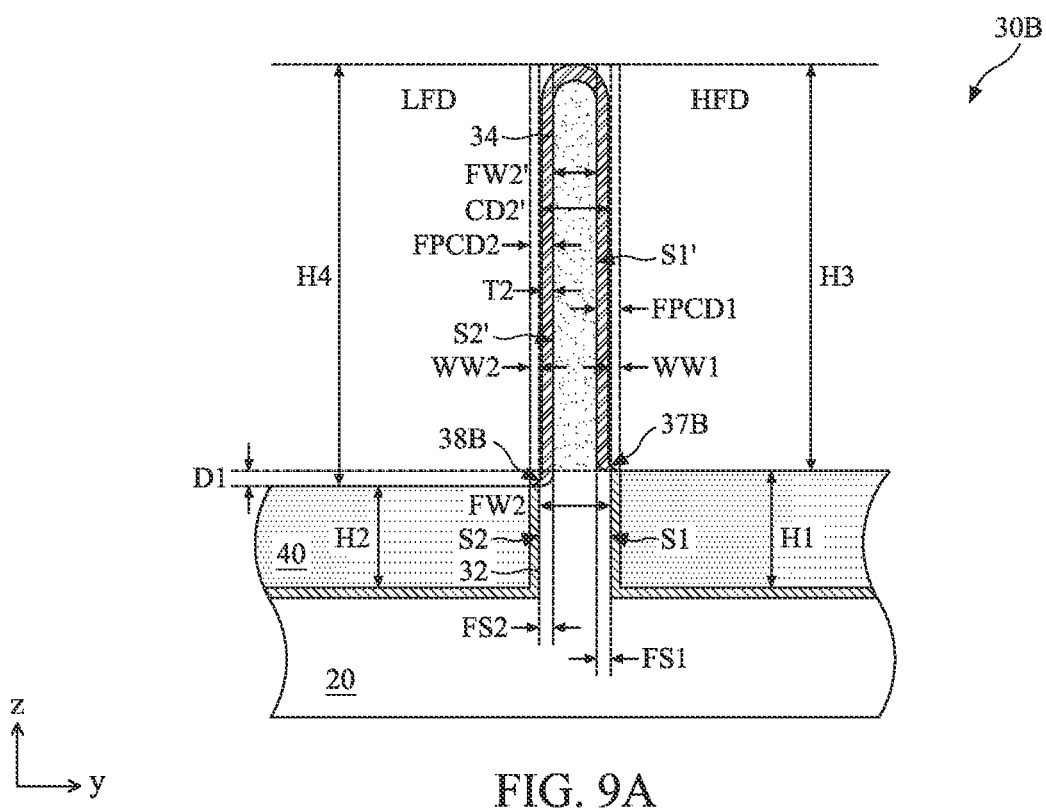
Figure 9B:
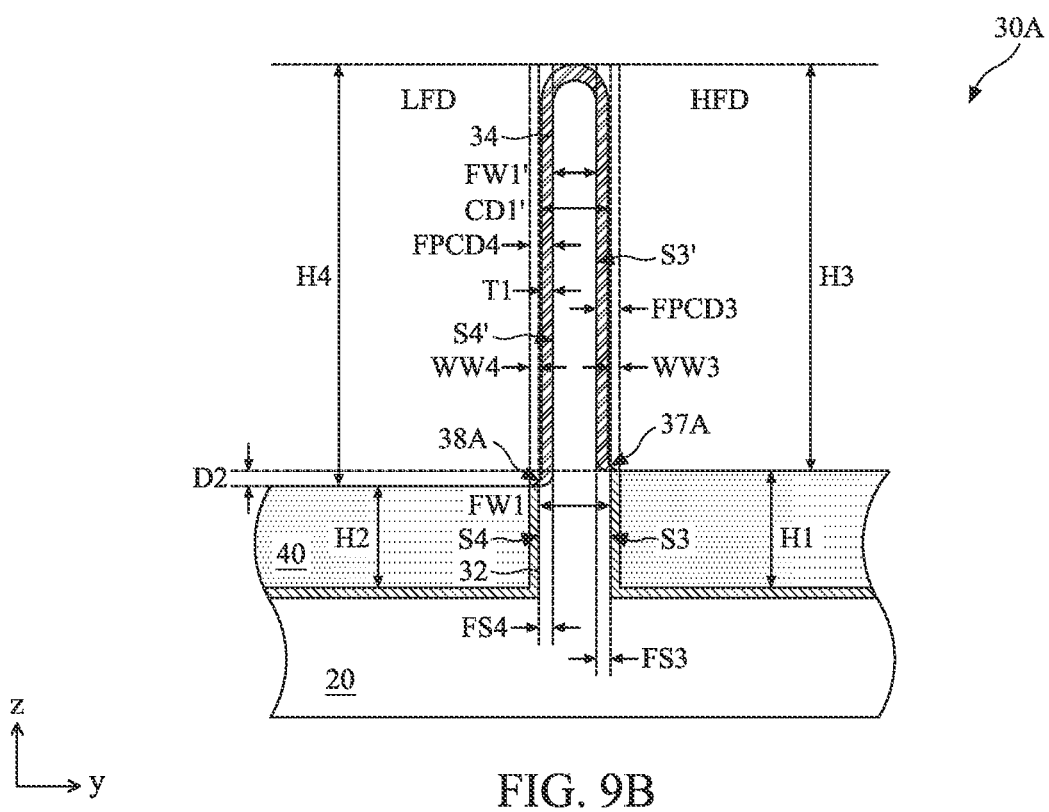

Referring to FIGS. 8, 9A, and 9B, the method 100 at operation 110 deposits the Si cap 34 to the thickness T1 over the trimmed first fin 30A having the trimmed fin width FW1' and to the thickness T2 over the trimmed the second fin 30B having the trimmed fin width FW2' as discussed above. As a result, the trimmed first fin 30A with the Si cap 34 is defined by the trimmed fin dimension CD1' and the trimmed second fin 30B with the Si cap 34 is defined by the trimmed fin dimension CD2'. In addition, as will be discussed in detail below, portions of the Si cap 34 extend laterally beyond the bottom portions of the trimmed first fin 30A and the trimmed second fin 30B to contact the dielectric liner 32, thereby forming wing-like structures 37A and 38A over the first fins 30A and wing-like structures 37B and 38B over the second fins 30B, where each of the wing-like structures is defined by a lateral dimension or wing width (WW). In some embodiments, the trimmed fin dimensions CD1' and CD2' are tuned to substantially the same value in order to achieve uniformity in feature sizes. As a result, the first fins 30A and the second fins 30B may be trimmed to different fin widths FW1' and FW2', respectively, due to differences in T1 and T2 discussed in detail above. Specifically, some embodiments provide that FW1' is greater than FW2', i.e., the second fins 30B are trimmed more than the first fins 30A.

The Si cap 34 may be formed epitaxially over the trimmed first fins 30A and the trimmed second fins 30B. For example, the method 200 may implement one or more selective epitaxial growth (SEG) process discussed above with respect to forming the layers 22A and 22B. The Si cap 34 may be grown epitaxially using gaseous and/or liquid precursors, which interact with the composition of the underlying substrate, i.e., the first fins 30A that include Si and the second fins 30B that include SiGe. In the present embodiments, the Si cap 34 selectively nucleates from or is epitaxially grown on semiconductor surfaces, e.g., the first fins 30A and the second fins 30B, but not on, or not substantially on, dielectric surfaces, e.g., the isolation structures 40 and the dielectric liner 32 (if included). In some embodiments, as will be discussed in detail below, small portions of the Si cap 34 is deposited over portions of the dielectric liner 32 due to epitaxial growth in a lateral direction (along the Y direction as depicted herein).

Referring to FIG. 9A, various embodiments of the structure of the device 10 after forming the Si cap 34 are discussed in detail with respect to the second fin 30B. As provided herein, trimming the second fin 30B results in a top portion of the second fin 30B above the isolation structures 40 to have a narrower fin width (i.e., the trimmed fin width FW2') than a bottom portion of the fin embedded in the isolation structures 40, which is defined by the fin width FW2 (i.e., width of an untrimmed second fin 30B). This may be due to less etchant loading at the bottom portions than at the top portions of the second fin 30B during the etching process 406. The fin width FW2 of an unetched portion of the second fin 30B may be defined as lateral separation (along the Y direction) between sidewalls S1 and S2, and the trimmed fin width FW2' may be defined as lateral separation between sidewalls S1' and S2'. In the present embodiments, a first transitional region between the sidewalls S1 and S1' and a second transitional region between the sidewalls S2 and S2' each have a tapered profile, i.e., each transitional region is defined by a curved surface. A lateral (along the Y direction) offset or displacement between S1 and S1' and between S2 and S2' is defined as fin shoulder FS1 and fin shoulder FS2, respectively. Stated differently, the first transitional region laterally extends from S1' by the distance of FS1 and the second transitional region laterally extends from S2' by the distance of FS2. Stated in yet another way, the fin width FW2 is the numeric sum of the trimmed fin widths FW2', the fin shoulder FS1, and the fin shoulder FS2, or FW2=FW2'+FS1+FS2. In some embodiments, as depicted herein, FS1 and FS2 are different in magnitude. In the present embodiments, regardless of the composition of the fins, the fin shoulder generally ranges from about 0.5 nm to about 3 nm; of course, the present embodiments do not limit the fin shoulder to a specific value. On one hand, if the fin shoulder is less than about 0.5 nm, indicating a lesser extent of trimming, then the subsequently deposited Si cap 34 may not be sufficiently thick to effectively prevent oxidation of the SiGe-based fins (i.e., the second fins 30B). On the other hand, if the fin shoulder is larger than about 3 nm, indicating a greater extent of trimming, then the structural integrity of the trimmed fin may be compromised.

Still referring to FIG. 9A, due to the presence of the fin shoulders, the formation of the Si cap 34 also tapers off at the transitional region extending from each of the sidewalls S1' and S2'. As discussed above, although the Si cap 34 generally does not epitaxially grow on a dielectric surface, such as on the dielectric liner 32 or the isolation structures 40, each fin shoulder provides a surface over which lateral epitaxial overgrowth of the Si cap 34 may occur, resulting in a small wing-like structures 37B and 38B each extending over a top surface of the dielectric liner 32, such that the outer edge of the Si cap 34 ends at the tip of each wing-like structure. The wing-like structure 37B may be defined by a wing width WW1 and the wing-like structure 38B may be defined by a wing width WW2, where WW1 is a lateral offset between the sidewall S1 and a tip of the wing-like structure 37B and WW2 is a lateral offset between the sidewall S2 and a tip of the wing-like structure 38B. In some embodiments, the magnitude of the wing width depends upon the epitaxial growth conditions of the Si cap 34. For example, if the rate of the epitaxial growth rate increases due to higher precursor concentration, the wing width also increases in magnitude. In this regard, because the Si cap 34 grows faster on SiGe than on Si as discussed above, the wing widths WW1 and WW2 of the second fins 30B generally greater than the wing widths WW3 and WW4 of the first fins 30A as depicted in FIG. 9B. In some examples, each of the wing widths WW1, WW2, WW3, and WW4 may be less than about 3 nm. In some examples, the wing-like structures 37B and/or 38B may be absent in the device 10, i.e., the Si cap 34 does not extend over the top surface of the dielectric liner 32, such that WW1 and/or WW2 are approximately 0. Furthermore, in the present embodiments, each of WW1 and WW2 is less than or equal to each of FS1 and FS2.

Furthermore, in the present embodiments, a fin protrusion dimension, or FPCD, accounts for both the fin shoulder and the wing width of a trimmed fin with the Si cap 34 formed thereover, i.e., FPCD1=FS1+WW1 and FPCD2=FS2+WW2. Therefore, in some examples, FPCD1 and FPCD2 may each be about 0.5 nm to about 6 nm, and a ratio of the FPCD (e.g., FPCD1 or FPCD2) to the trimmed fin dimension CD2' may be about 0.05 to about 1.2 (see examples of CD1' and CD2' discussed above). In some instances, too much enlargement of the FPCD due to the formation of the fin shoulders and/or the wing-like structures may induce leakage issues, leading to degradation of device performance. Accordingly, the present embodiments provide that the FS1 and FS2 to be from about 0.5 nm to about 3 nm and the WW1 and WW2 to be less than about 3 nm.

Still further, the wing-like structures extending from opposite sidewalls of the second fin 30B may be vertically displaced due to difference in etchant loading as discussed above with respect to FIGS. 7A and 7B. For example, the wing-like structure 37B is disposed above the wing-like structure 38B by a vertical distance D1. As depicted herein, such vertical offset is consistent with the difference between the height H1 and the height H2 discussed above with respect to FIG. 6. Stated differently, a vertical position of a wing-like structure is inversely correlated with the fin's step height measured from the top surface of the isolation structures 40 to a top surface of the fin along a given sidewall. Because portions of the isolation structures 40 in the LFD regions are etched more than the portions in the HFD regions as discussed above, the second fin 30B has a fin step height H3 in the HFD region that is less than a fin step height H4 in the LFD region. Accordingly, the wing-like structure 37B, which is disposed in the HFD region, is above the wing-like structure 38B, which is disposed in the LFD region.

FIG. 9B depicts an embodiment of the trimmed first fin 30A with various features exhibiting structural relationships similar to those of the trimmed second fin 30B as depicted and discussed in reference to FIG. 9A. For example, a third transitional region between the sidewalls S3 and S3' and a fourth transitional region between the sidewalls S4 and S4' each has a tapered profile, and a lateral (along the Y direction) displacement between S3 and S3' and between S4 and S4' is defined as fin shoulder FS3 and fin shoulder FS4, respectively. Stated differently, the fin width FW1 is the numeric sum of the trimmed fin widths FW1', the fin shoulder FS3, and the fin shoulder FS4, or FW1=FW1'+FS3+FS4. In the present embodiments, each of FS3 and FS4 is less than FS1 and FS2 since the first fins 30A are generally trimmed to a lesser extent than the second fins 30B as discussed in detail above. The deposition of the Si cap 34 over each trimmed first fin 30A forms the wing-like structures 37A and 38A defined by wing widths WW3 and WW4, respectively, which contribute to magnitude of FPCD3 and FPCD4 defined similarly as the FPCD1 and FPCD2 above. In the present embodiments, each of WW3 and WW4 is generally less than each of WW1 and WW2 since the rate of the epitaxial growth of the Si cap 34 is generally lower on the first fins 30A than on the second fins 30B. Accordingly, in the present embodiments, each of FPCD3 and FPCD4 is generally less than each of FPCD1 and FPCD2. Furthermore, in the present embodiments, each of WW3 and WW4 is generally less than each of FS3 and FS4. Still similar to the embodiment of the second fin 30B depicted in FIG. 9A, the wing-like structures 37A and 38A may be vertically displaced by a distance D2, and such displacement is inversely correlated to a difference in the fin step heights between the HFD region and the LFD region.

Figure 10A:
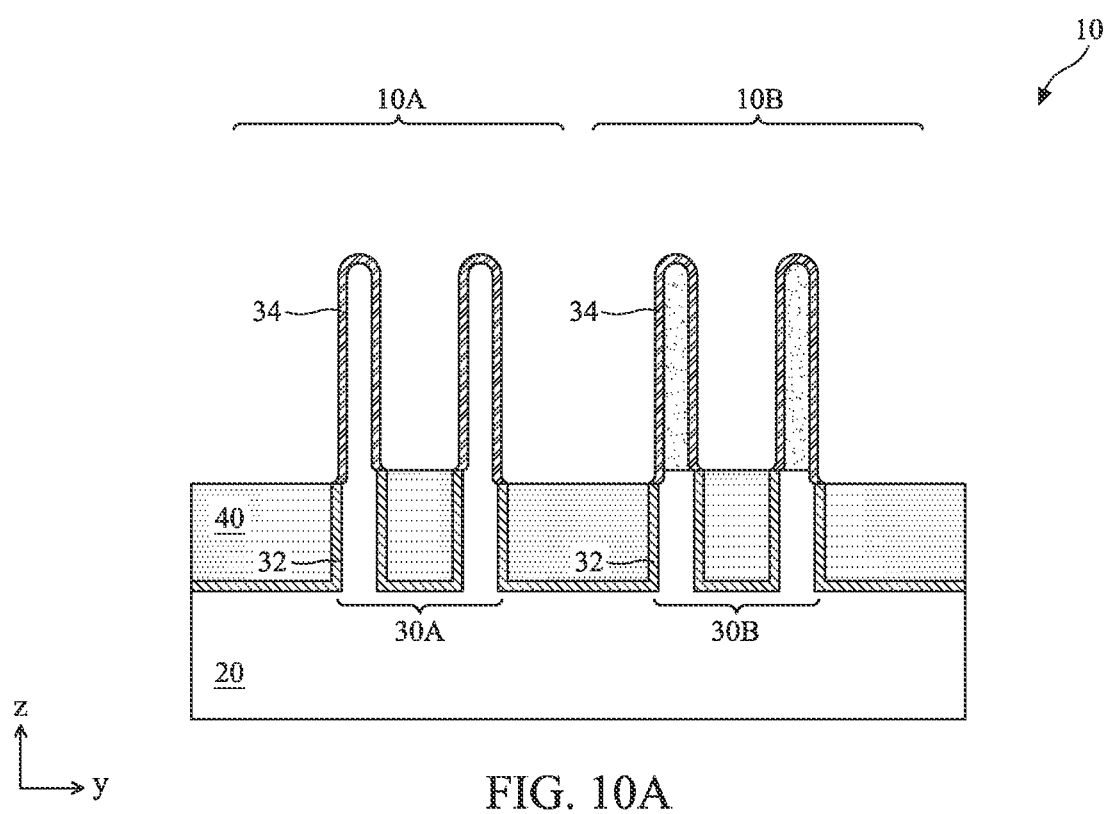
FIGS. 10A, 11A, 12A, 13A, 14A, and 15A show cross-sectional views of the semiconductor structure of FIG. 2 taken along line A-A' during intermediate steps of implementing an embodiment of the method of FIGS. 1A and 1B according to aspects of the present disclosure.
Figure 10B:
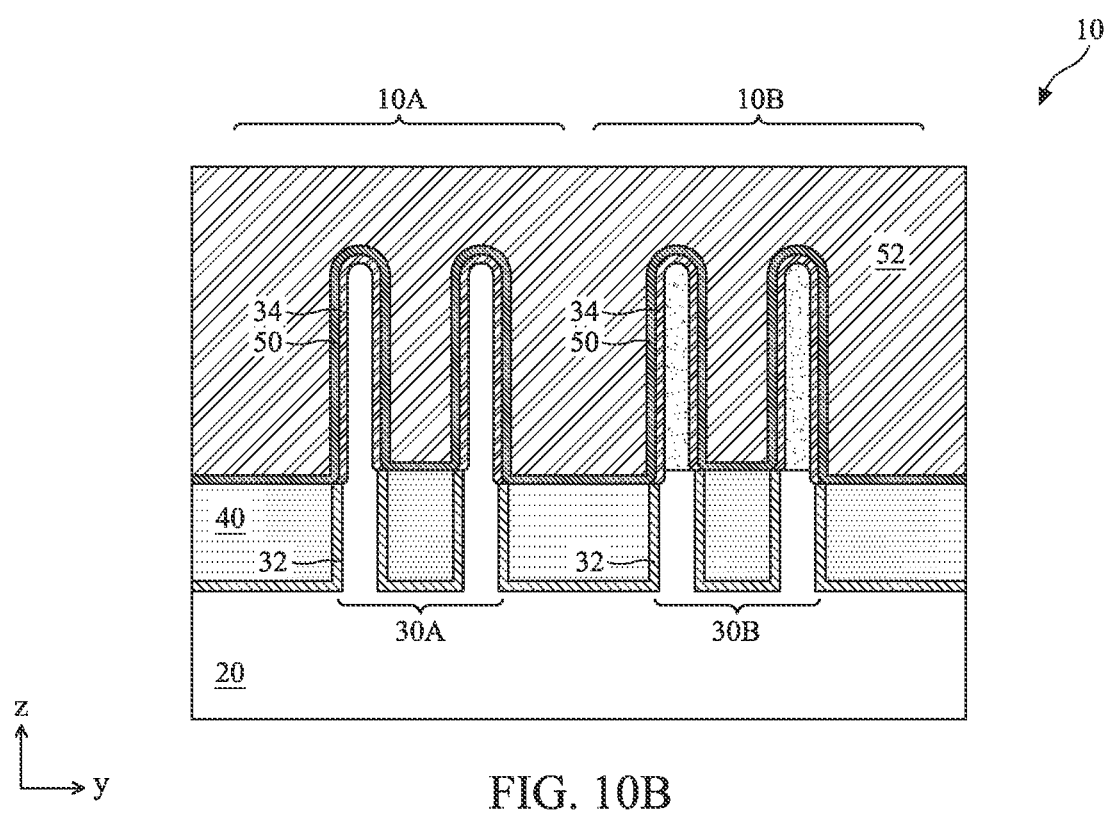
FIGS. 10B, 11B, 12B, 13B, 14B, and 15B show cross-sectional views of the semiconductor structure of FIG. 2 taken along line B-B' during intermediate steps of implementing an embodiment of the method of FIGS. 1A and 1B according to aspects of the present disclosure.
Figure 11A:
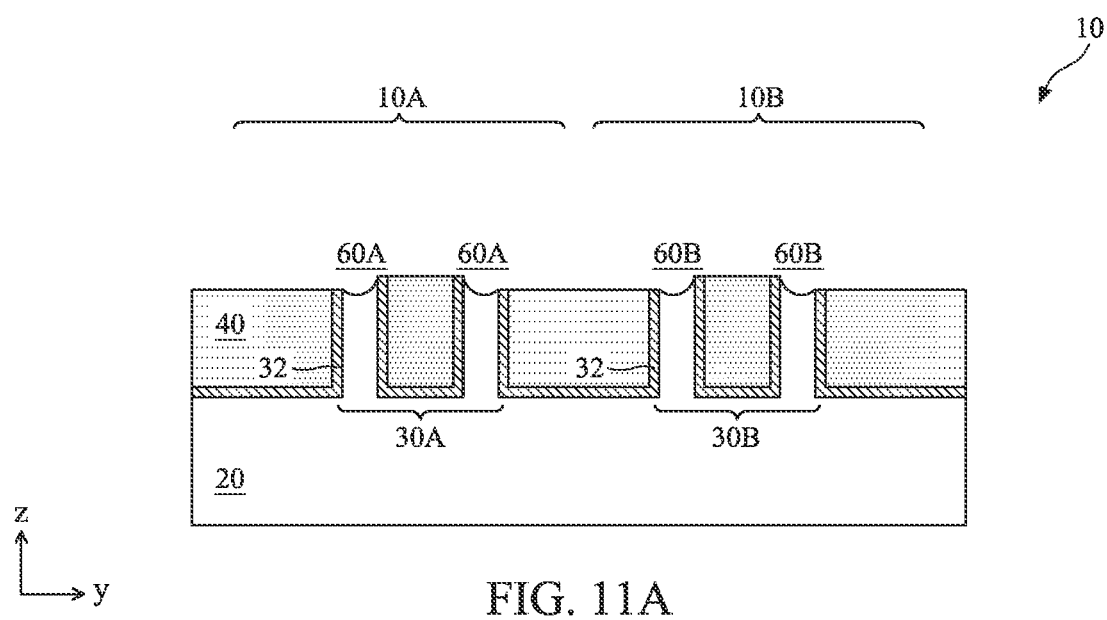
Figure 11B:
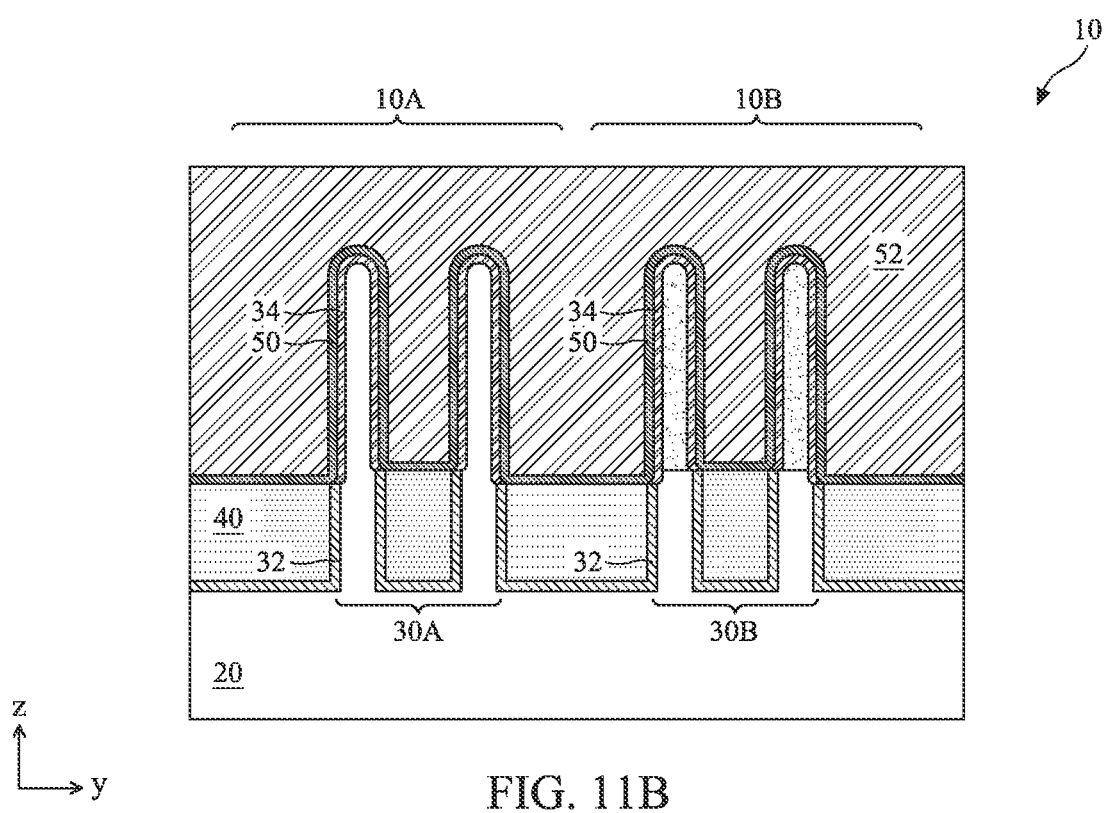
Figure 12A:
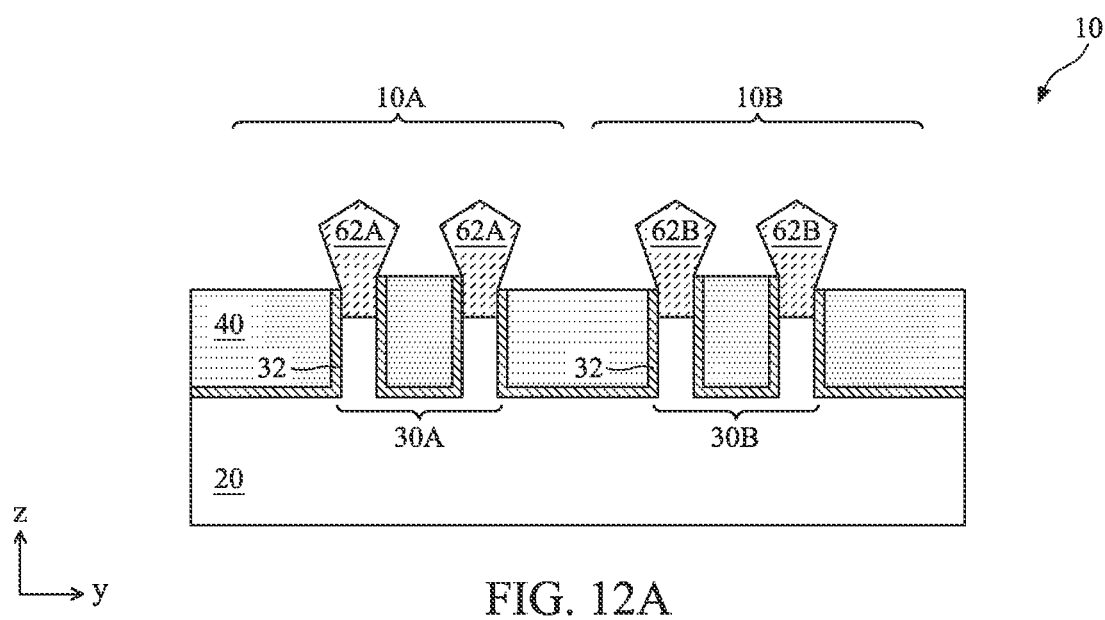
Figure 12B:
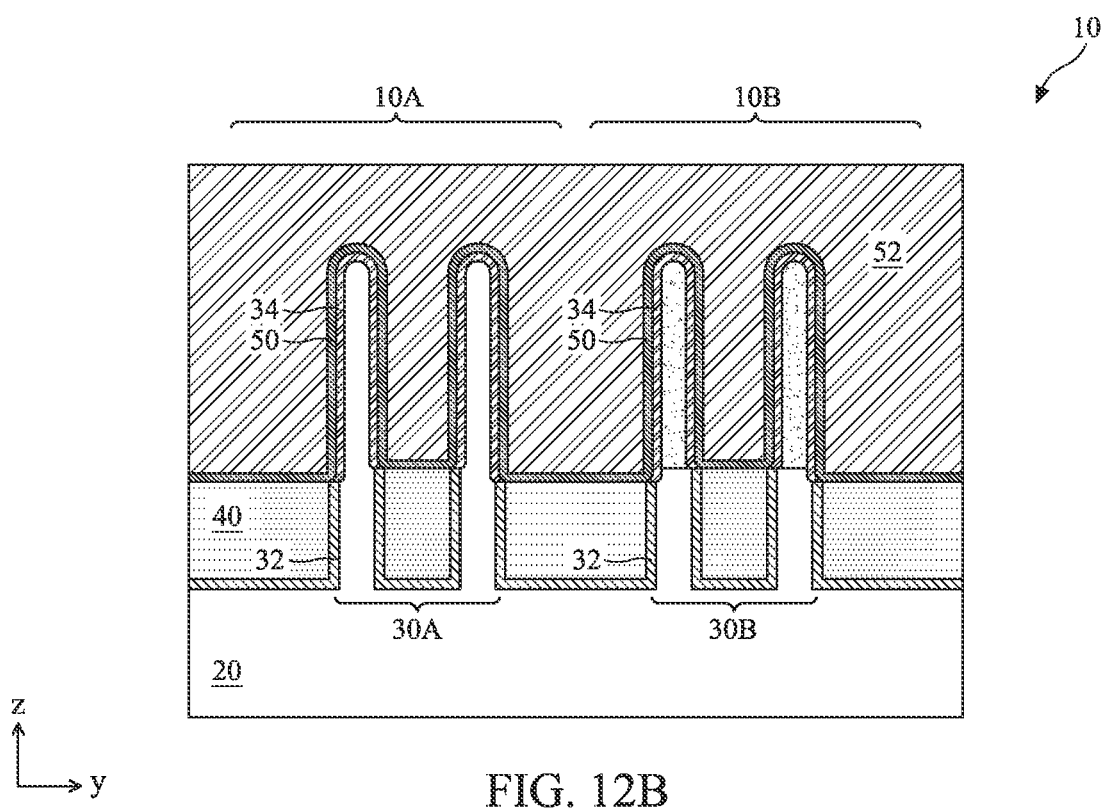

Now referring to FIGS. 10A and 10B, the method 100 at operation 112 forms a dummy (or placeholder) gate stack 52 over the channel region of the first fins 30A and the second fins 30B as shown in FIG. 10B. As depicted in FIG. 10A, S/D regions of the first fins 30A and the second fins 30B remain substantially the same as that depicted in FIGS. 8, 9A, and 9B during operation 112. In the present embodiments, the method 100 first forms an interfacial layer (IL) 50 over the Si cap 34 in the device region 10A and the device region 10B before forming the dummy gate stack 52. The IL 50 may include a suitable material such as silicon oxide (e.g., SiO$_2$) and may be formed over the Si cap 34 by a deposition process (e.g., CVD), thermal oxidation, chemical oxidation, other suitable processes, or combinations thereof. Generally, the process of forming the IL 50 may inadvertently oxidize SiGe-based second fins 30B, thereby degrading the device performance. In the present embodiments, however, the Si cap 34 formed at operation 110 is configured to protect the underlying second fins 30B during operation 112 and/or any subsequent oxidation process.

The dummy gate stack 52 is configured to be replaced by a metal gate stack either in portion or in entirety during subsequent processing steps. The dummy gate stack 52 includes at least a gate electrode layer comprising polysilicon, which may be formed over the IL 50 by first depositing a blanket layer of polysilicon over the device 10 and subsequently applying an anisotropic etching process to form the dummy gate stack 52. The dummy gate stack 52 may include additional material layers, such as a gate dielectric layer, a hard mask layer, other suitable layers, or combinations thereof. Various layers of the dummy gate stack 52 may be formed by suitable processes such as CVD, ALD, PVD (physical vapor deposition), other suitable methods, or combinations thereof.

Though not depicted herein, the method 100 at operation 112 forms gate spacers on sidewalls of the dummy gate stack 52. In some embodiments, the gate spacers include a dielectric material such as silicon dioxide, silicon nitride, carbon- and/or oxygen-doped silicon nitride, silicon carbide, oxygen-doped silicon carbide, a low-k dielectric material, a high-k dielectric material, other suitable dielectric materials, or combinations thereof. The gate spacers may be formed by first depositing a blanket of spacer material over the device 10, and then performing an anisotropic etching process to remove portions of the spacer material to form the gate spacers on the sidewalls of the dummy gate stack 52.

Now referring to FIGS. 11A to 12B, the method 100 at operation 114 forms S/D features 62A and 62B in the S/D regions of the first fins 30A and the second fins 30B (FIGS. 11A and 12A), respectively, while the channel regions of the first fins 30A and the second fins 30B (FIGS. 11B and 12B) remain substantially the same as that depicted in FIG. 10B. In the present embodiments, the S/D features 62A and 62B include dopants (or impurities) suitable for forming a desired device. In the present embodiments, the S/D features 62A are doped with an n-type dopant to provide an NMOS device and the S/D features 62B are doped with a p-type dopant to provide a PMOS device. The S/D features 62A and 62B may be formed by any suitable techniques, such as etching processes followed by one or more epitaxy processes. In one example, referring to FIG. 11A, one or more etching processes are performed to remove portions of the first fins 30A and the second fins 30B to form recesses 60A and 60B, respectively. A cleaning process may be subsequently performed to clean the recesses 60A and 60B with a hydrofluoric acid (HF) solution and/or other suitable solutions. Thereafter, one or more epitaxy growth processes similar to that discussed above with respect to forming the Si cap 34 are implemented to the S/D features 62A and 62B in the recesses 60A and 60B, respectively. The S/D features 62A may include one or more epitaxial layers of silicon (epi Si) or silicon carbon (epi SiC) doped with an n-type dopant such as arsenic, phosphorus, other n-type dopant, or combinations thereof, and the S/D features 62B may include one or more epitaxial layers of silicon germanium (epi SiGe) doped with a p-type dopant such as boron, germanium, indium, other p-type dopants, or combinations thereof. The method 100 at operation 114 may subsequently perform an annealing processing to the S/D features 62A and 62B to activate the dopant(s).

Figure 13A:
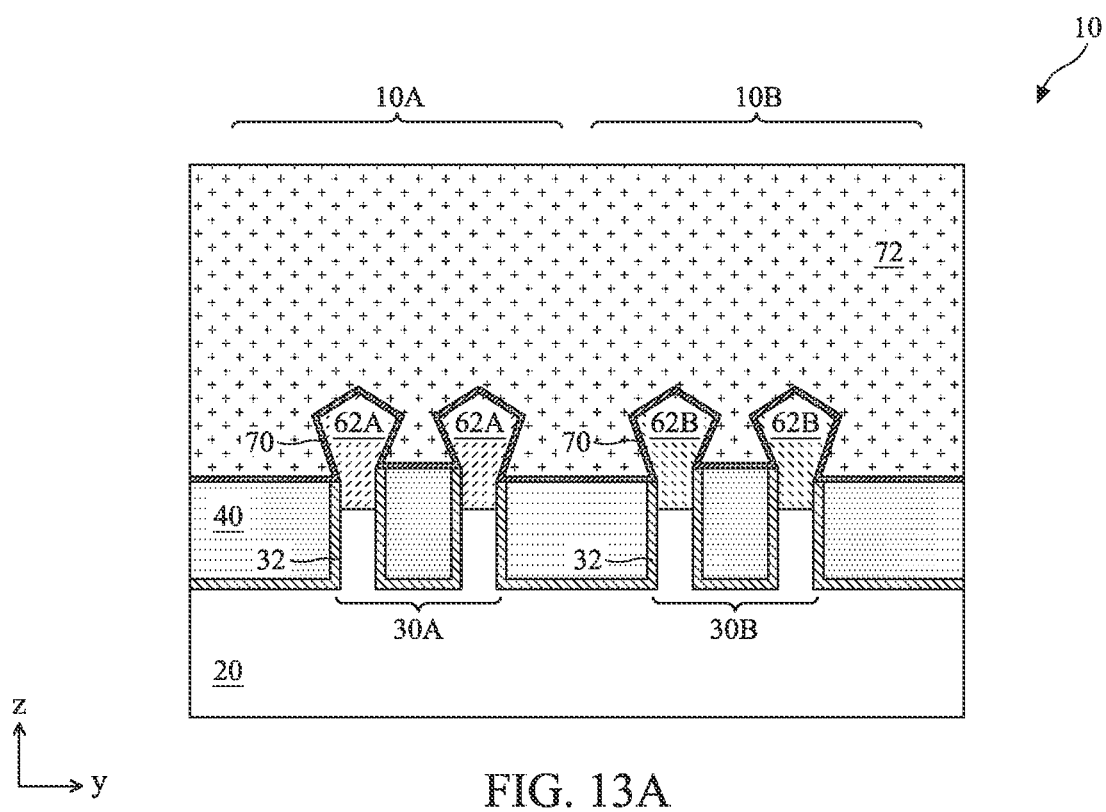
Figure 13B:
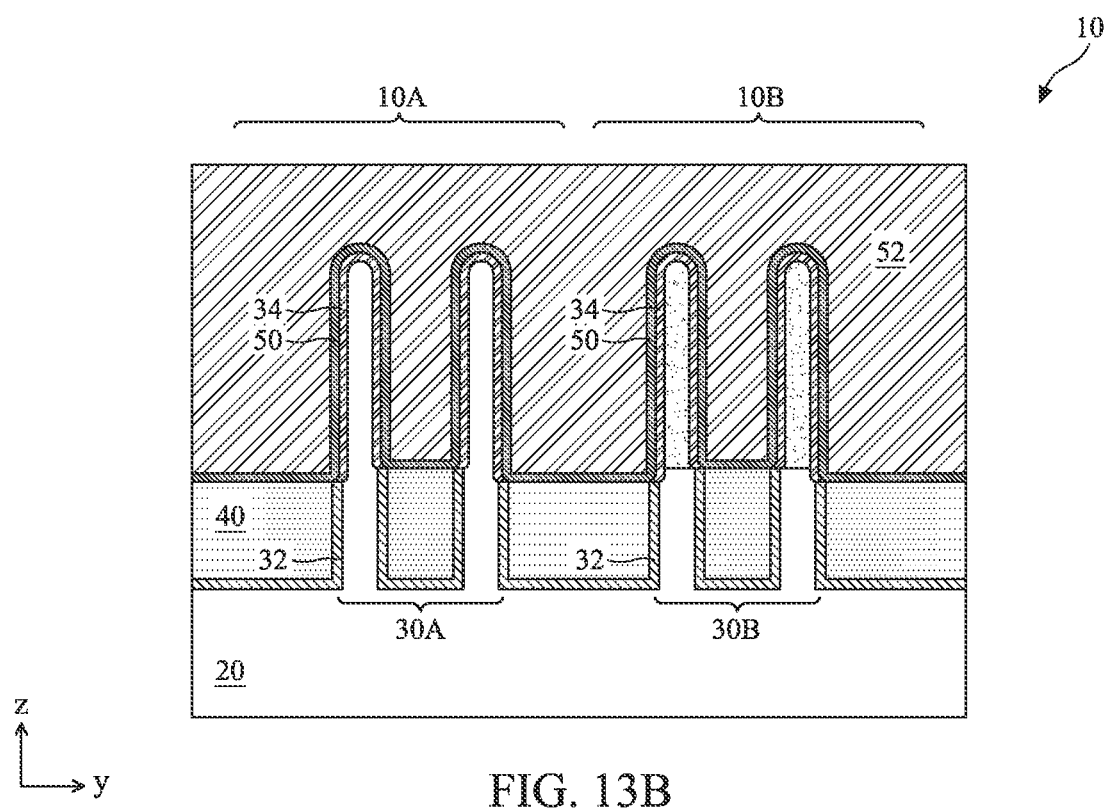
Figure 14A:
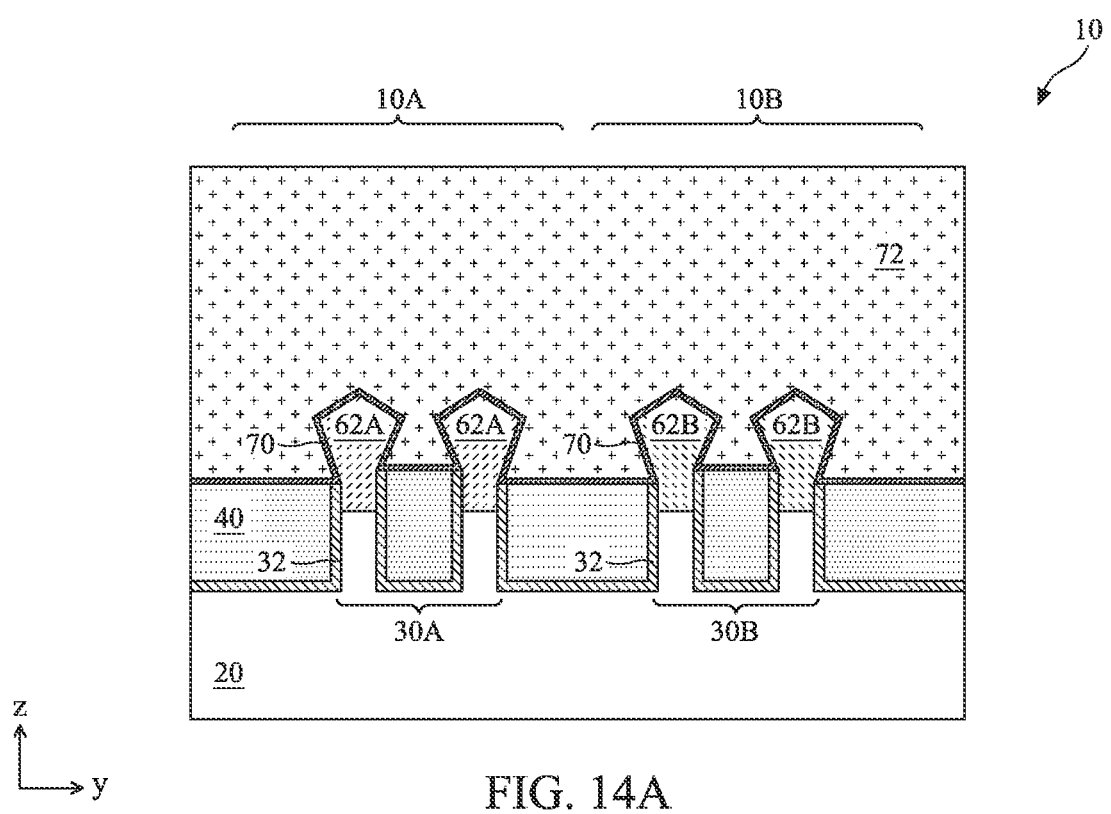
Figure 14B:
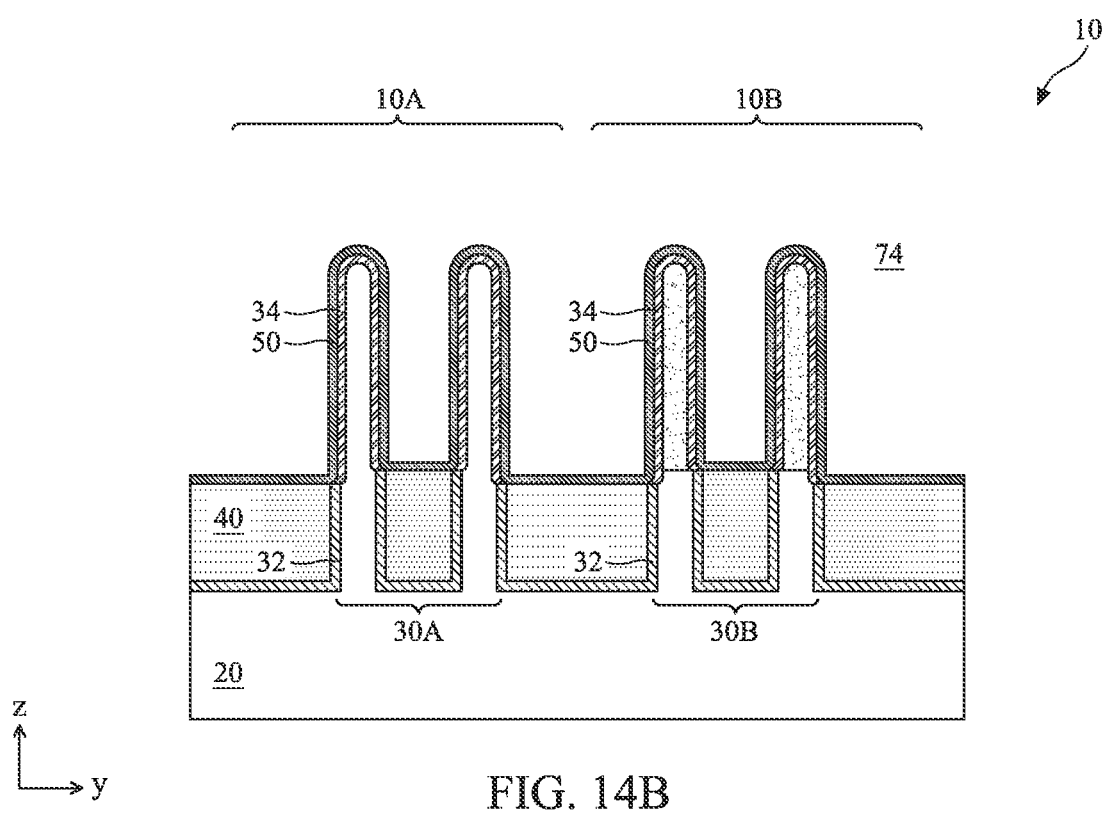

Subsequently, referring to FIGS. 13A to 15B, the method 100 at operation 116 replaces the dummy gate stack 52 with a metal gate stack 80. Referring to FIGS. 13A, before removing the dummy gate stack 52 to form a gate trench 74, the method 100 first forms an etch-stop layer (ESL) 70 over the S/D features 62A and 62B. In the present embodiments, the ESL 70 includes a dielectric material such as silicon nitride, carbon doped-silicon nitride, aluminum oxide, aluminum nitride, other suitable materials, or combinations thereof. The ESL 70 may be deposited conformally over the device 10 by CVD, ALD, other suitable deposition methods, or combinations thereof. Thereafter, the method 100 forms an interlayer dielectric (ILD) layer 72 over the device 10 and subsequently performs a CMP process to expose a top surface of the dummy gate stack 52. In the present embodiments, the ILD layer 72 includes a dielectric material, such as silicon dioxide (SiO$_2$), a low-k dielectric material, tetraethylorthosilicate (TEOS), doped silicon dioxide such as borophosphosilicate glass (BPSG), fluoride-doped silicate glass (FSG), phosphosilicate glass (PSG), boron-doped silicate glass (BSG), other suitable dielectric materials, or combinations thereof. The ILD layer 72 may include a multi-layer structure or a single-layer structure and may be formed by a deposition process such as CVD, FCVD, SOG, other suitable methods, or combinations thereof. Referring to FIGS. 14A and 14B, the method 100 then removes the dummy gate stack 52 to form the gate trench 74 adjacent to the S/D features 62A and 62B. The method 100 selectively removes the dummy gate stack 52 without removing or substantially removing other portions of the device 10. In some embodiments, as depicted herein, the IL 50 remains over the Si cap 34 after removing the dummy gate stack 52 and becomes a portion of the metal gate stack 80 formed thereafter.

Figure 15A:
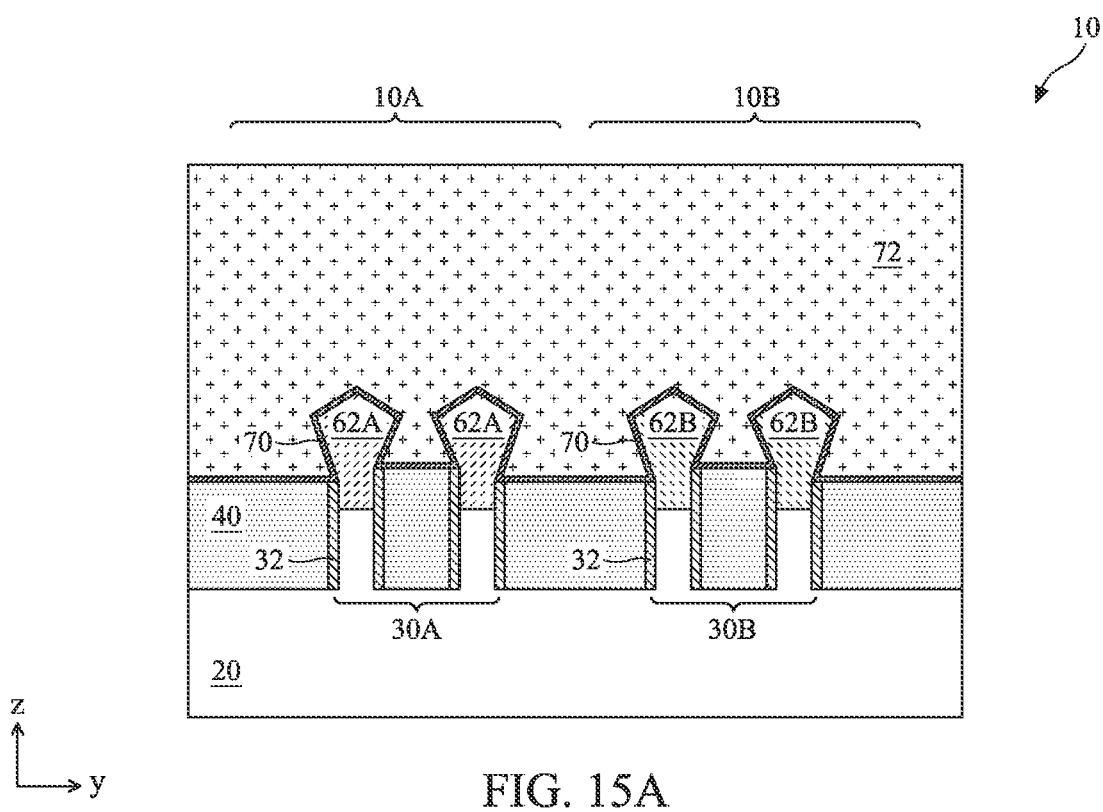
Figure 15B:
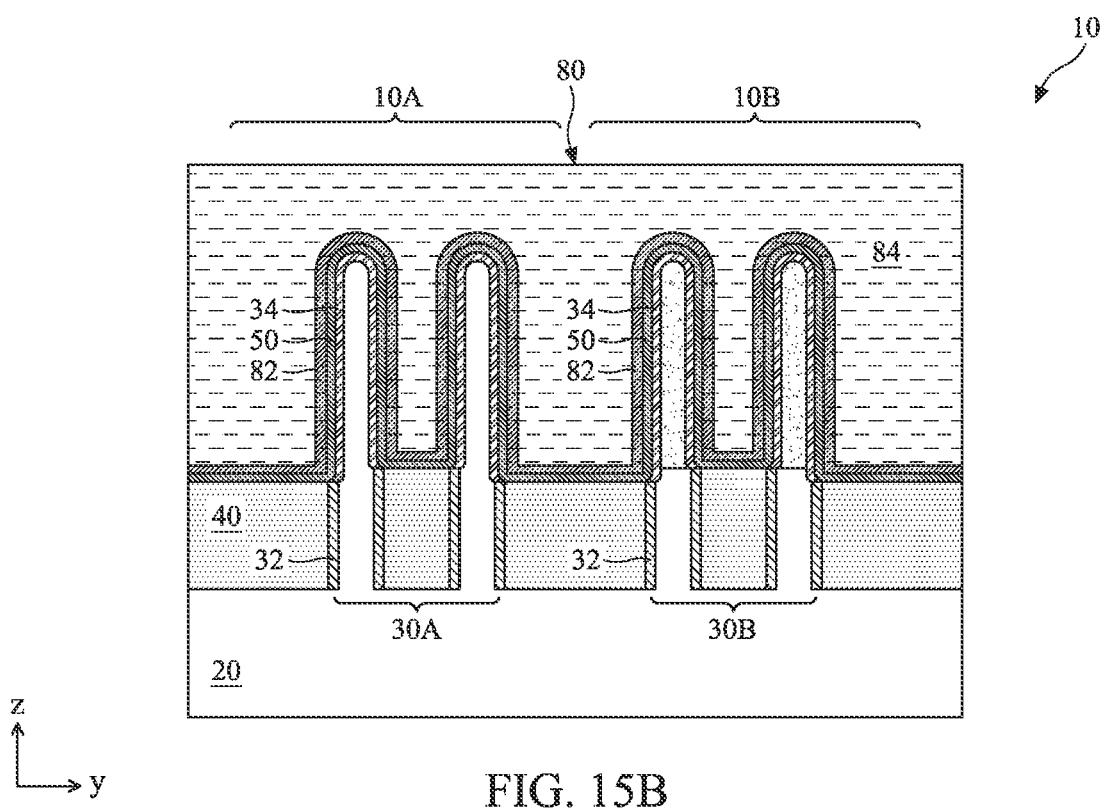

Thereafter, referring to FIGS. 15A and 15B, the method 100 forms the metal gate stack 80 in the gate trench 74. In the present embodiments, the metal gate stack 80 includes at least a gate dielectric layer 82 disposed over the IL 50 and a metal gate electrode 84 disposed over the gate dielectric layer 82. The gate dielectric layer 82 may include silicon oxide, silicon oxynitride, aluminum silicon oxide, a high-k dielectric material (i.e., having a dielectric constant greater than that of silicon oxide, which is approximately 3.9) such as hafnium oxide, zirconium oxide, lanthanum oxide, titanium oxide, yttrium oxide, strontium titanate, other suitable dielectric materials, or combinations thereof. In the present embodiments, the metal gate electrode 84 includes at least a work-function metal layer (not depicted separately) disposed over the gate dielectric layer 82 and a bulk conductive layer (not depicted separately) disposed over the work-function metal layer. The work-function metal layer may be a p-type or an n-type work-function metal layer, and may include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work-function materials, or combinations thereof. The metal gate electrode 84 may include additional work-function metal layers having similar or different conductivity type(s). The bulk conductive layer may include Cu, W, Al, Co, Ru, other suitable metals, or combinations thereof. The metal gate stack 80 may further include other layers (not depicted), such as a capping layer, a barrier layer, other suitable layers, or combinations thereof. Various layers of the metal gate stack 80 may be deposited by any suitable method, such as ALD, CVD, PVD, plating, other suitable methods, or combinations thereof.

Subsequently, the method 100 at operation 118 may perform additional processing steps to the device 10, including multiple dielectric layers and conductive features disposed in the dielectric layers. For example, the method 100 may form S/D contacts (not depicted) in the ILD layer 72 to contact the S/D features 62A and/or 62B, as well one or more gate contacts (not depicted) to contact the metal gate stack 80. Furthermore, the method 100 may form a multi-layer interconnect (MLI) structure over the S/D contacts and the gate contacts. The MLI may include horizontal interconnect features (e.g., metal lines) and vertical interconnect features (e.g., vias) disposed in various ILD layers and ESLs, where the vertical interconnect features are configured to connect horizontal interconnect features of different layers.

Although not intended to be limiting, one or more embodiments of the present disclosure provide many benefits to a semiconductor device and the formation thereof. The present disclosure provides methods of selectively trimming Si-based fins and SiGe-based fins without the need to implement photolithography processes and forming a Si cap (alternatively referred to as a Si-containing layer) over the trimmed Si-based fins and SiGe-based fins to protect the SiGe-based fins from inadvertent oxidation during subsequent fabrication processes. Embodiments of the present disclosure provide a tunable trimming process based on a desirable thickness of the Si cap over the SiGe-based fins, such that the resulting fin dimension (including the thickness of the Si cap) stays consistent with the desired feature sizes (e.g., CDs). In the present embodiments, the resulting trimmed fins exhibit various structural features, such as fin shoulders and wing-like structures, that reflect the extent of the trimming process and the subsequent Si cap formation process. Advantageously, device structures of the present disclosure provide SiGe-based channels to address challenges associated with the tuning of VI when features sizes, such as fin dimensions, continue to decrease.

In one aspect, the present embodiments provide a semiconductor structure that includes a silicon-germanium (SiGe) fin protruding from a substrate and isolation features disposed over the substrate and surrounding a bottom portion of the SiGe fin, where the SiGe fin includes a top portion having a first sidewall and a second sidewall disposed over the bottom portion having a third sidewall and a fourth sidewall, and where a first transition region connecting the first sidewall to the third sidewall and a second transition region connecting the second sidewall to the fourth sidewall each have a tapered profile extending away from the first sidewall and the second sidewall, respectively. The semiconductor structure further includes a Si-containing layer disposed on the top portion of the SiGe fin, where a first portion of the Si-containing layer disposed on the first transition region extends away from the first sidewall by a first lateral distance and a second portion of the Si-containing layer disposed on the second transition region extends away from the second sidewall by a second lateral distance that is different from the first lateral distance, and where separation between outer vertical surfaces of the Si-containing layer is defined by a third lateral distance. Furthermore, the semiconductor structure includes a metal gate stack disposed over the Si-containing layer in a channel region of the SiGe fin.

In another aspect, the present embodiments provide a semiconductor structure that includes a semiconductor substrate having a first region and a second region, isolation structures disposed over the first region and the second region, a first fin protruding from the semiconductor substrate in the first region, a second fin protruding from the semiconductor substrate in the second region, a Si layer disposed over the first fin and the second fin, and a metal gate stack disposed over the Si layer in a channel region of the first fin and a channel region of the second fin. In the present embodiments, the first fin includes silicon (Si) and is substantially free of germanium (Ge), where a portion of the first fin in contact with a top surface of the isolation structures laterally extends away from a sidewall of the first fin to form a first fin shoulder. Furthermore, the second fin includes Si and Ge, where a portion of the second fin in contact with the top surface of the isolation structures laterally extends away from a sidewall of the second fin to form a second fin shoulder, and where the second fin shoulder has a width greater than the first fin shoulder. Still further, a portion of the Si layer disposed over the first fin has a first thickness and a portion of the Si layer disposed over the second fin has a second thickness that is greater than the first thickness.

In yet another aspect, the present embodiments provide a method that includes forming a semiconductor substrate having a first region and a second region, forming a first fin protruding from the first region and a second fin protruding from the second region, where the first fin includes silicon-germanium (SiGe) and the second fin includes silicon (Si) but is free of germanium (Ge), determining a thickness of a Si-containing layer to be deposited over the first fin, and trimming the first fin based on the thickness of the Si-containing layer, where trimming the first fin forms a fin shoulder that protrudes from a sidewall of the trimmed first fin. Subsequently, the method proceeds to depositing the Si-containing layer to the determined thickness over the trimmed first fin, where a portion of the Si-containing layer laterally extends beyond the fin shoulder, forming a dummy gate stack over portions of the Si-containing layer, forming source/drain (S/D) features adjacent to the dummy gate stack in the first fin and the second fin, and replacing the dummy gate stack with a metal gate stack.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a semiconductor substrate;
   a silicon-germanium (SiGe) fin protruding from the semiconductor substrate, wherein the SiGe fin includes a top portion having a first sidewall and a second sidewall disposed over a bottom portion having a third sidewall and a fourth sidewall, and wherein a first transition edge connecting the first sidewall to the third sidewall and a second transition edge connecting the second sidewall to the fourth sidewall each have a tapered profile extending away from the first sidewall and the second sidewall, respectively, wherein the first transition edge extends to a greater height above the substrate than the second transition edge;
   isolation features disposed over the semiconductor substrate and surrounding the bottom portion of the SiGe fin;
   a Si-containing layer disposed on the top portion of the SiGe fin, wherein a first portion of the Si-containing layer disposed on the first transition edge extends away from the first sidewall by a first lateral distance and a second portion of the Si-containing layer disposed on the second transition edge extends away from the second sidewall by a second lateral distance that is different from the first lateral distance, and wherein separation between outer vertical surfaces of the Si-containing layer is defined by a third lateral distance; and
   a metal gate stack disposed over the Si-containing layer in a channel region of the SiGe fin.

2. The semiconductor structure of claim 1, wherein separation between the first sidewall and the second sidewall defines a first width of the SiGe fin and separation between the third sidewall and the fourth sidewall defines a second width of the SiGe fin that is greater than the first width.

3. The semiconductor structure of claim 1, wherein a ratio of the first lateral distance to the third lateral distance and a ratio of the second lateral distance to the third lateral distance is each about 0.05 to about 1.2.

4. The semiconductor structure of claim 1, wherein the first transition edge and the second transition edge extend from the first sidewall and the second sidewall, respectively, by about 0.5 nm to about 3 nm.

5. The semiconductor structure of claim 4, wherein the first portion of the Si-containing layer extends away from the third sidewall by a fourth lateral distance and the second portion of the Si-containing layer extends away from the fourth sidewall by a fifth lateral distance, and wherein the fourth lateral distance and the fifth lateral distance are less than or equal to a width of the first transition edge and a width of the second transition edge, respectively.

6. The semiconductor structure of claim 1, wherein the first transition edge and the second transition edge are vertically offset along a height of the SiGe fin.

7. The semiconductor structure of claim 1, further comprising a dielectric liner disposed between the isolation features and the bottom portion of the SiGe fin, wherein the first portion, the second portion, or both portions of the Si-containing layer extend over the dielectric liner.

8. The semiconductor structure of claim 7, wherein a portion of the dielectric liner disposed on the third sidewall has a first height and a portion of the dielectric liner disposed on the fourth sidewall has a second height that is different from the first height.

9. The semiconductor structure of claim 1, further comprising:
   a dielectric isolation structure disposed on the semiconductor substrate, the Si—Ge fin protruding through the dielectric isolation structure;
   a dielectric layer disposed along and interfacing with a sidewall of the Si—Ge fin such that the dielectric layer prevents the dielectric isolation structure from interfacing with the Si—Ge fin, the sidewall of the Si—Ge fin facing the dielectric isolation structure, wherein the dielectric layer is formed of a different material than the Si-containing layer, and
   wherein the dielectric layer and the Si-containing layer interface with each other.

10. A semiconductor structure, comprising:
    a semiconductor substrate including a first region and a second region;
    isolation structures disposed over the first region and the second region;
    a first fin protruding from the semiconductor substrate in the first region, wherein the first fin includes silicon (Si) and is substantially free of germanium (Ge), wherein the first fin includes a first upper portion and a first lower portion, wherein the first upper portion has a first edge and an opposing second edge and the first lower portion has a third edge and an opposing fourth edge, wherein the first fin further includes a first transition edge tapering away from the first edge to the third edge, the first edge and the third edge being on the same side of the first fin;
    a second fin protruding from the semiconductor substrate in the second region, wherein the second fin includes Si and Ge, wherein the second fin includes a second upper portion and a second lower portion, wherein the second upper portion has a fifth edge and an opposing sixth edge and the first lower portion has a seventh edge and an opposing eighth edge, wherein the second fin further includes a second transition edge tapering away from the fifth edge to the seventh edge, the fifth edge and the seventh edge being on the same side of the second fin, wherein the first transition edge extends to a different height above the substrate than the second transition edge and wherein the first fin and the second fin extend to the same height above the substrate;

a Si layer disposed over the first fin and the second fin, wherein a portion of the Si layer disposed over the first fin has a first thickness and a portion of the Si layer disposed over the second fin has a second thickness that is greater than the first thickness; and a metal gate stack disposed over the Si layer in a channel region of the first fin and a channel region of the second fin.

11. The semiconductor structure of claim 10, wherein an outermost edge of the Si layer laterally extends from the sidewall of the first fin by a first distance and an outermost edge of the Si layer laterally extends from the sidewall of the second fin by a second distance that is greater than the first distance.

12. The semiconductor structure of claim 11, wherein a ratio of the first distance or a ratio of the second distance to a separation distance between vertical sidewalls of the Si layer is about 0.05 to about 1.2.

13. The semiconductor structure of claim 10, wherein a bottom portion of the first fin and a bottom portion of the second fin are embedded in the isolation structures, the semiconductor structure further comprising a dielectric layer disposed between the isolation structures and the bottom portion of the first fin and between the isolation structures and the bottom portion of the second fin.

14. The semiconductor structure of claim 13, wherein the Si layer extends laterally to contact a top surface of the dielectric layer.

15. The semiconductor structure of claim 10, wherein the first transition edge extends to a greater height above the substrate than the second transition edge.

16. The semiconductor structure of claim 10, wherein the second transition edge extends to a greater height above the substrate than the first transition edge.

17. A device comprising:
a first fin structure formed of a first semiconductor material disposed on a substrate, the first fin structure including a first upper portion and a first lower portion, wherein the first upper portion has a first edge and an opposing second edge and the first lower portion has a third edge and an opposing fourth edge, wherein the first fin structure further includes a first transition edge tapering away from the first edge to the third edge, the first edge and the third edge being on the same side of the first fin structure, wherein the first fin structure further includes a second transition edge tapering away from the second edge to the fourth edge, the second edge and the fourth edge being on the same side of the first fin structure, and wherein the first transition edge extends to a greater height above the substrate than the second transition edge;

a silicon-containing layer disposed directly on the first edge and the first transition edge;

a liner layer disposed directly on third edge of the first lower portion of the first fin structure;

a gate dielectric layer disposed directly on the silicon-containing layer; and a gate electrode layer disposed on the gate dielectric layer.

18. The device of claim 17, wherein the first semiconductor material includes germanium.

19. The device of claim 17, further comprising:
a second fin structure formed of a second semiconductor material disposed on the substrate, the second fin structure includes a second upper portion and a second lower portion, wherein the second upper portion has a fifth edge and an opposing sixth edge and the first lower portion has a seventh edge and an opposing eighth edge, wherein the second fin structure includes a third transition edge tapering away from the fifth edge to the seventh edge, the fifth edge and the seventh edge being on the same side of the second fin structure, and wherein the second semiconductor material is formed of a different material composition than the first semiconductor material, and wherein the silicon-containing layer is disposed directly on the fifth edge and the second transition edge.

20. The device of claim 19, wherein the first transition edge extends to a greater height above the substrate than the third transition edge.

* * * * *